(12) United States Patent
Plett

(10) Patent No.: US 7,521,895 B2
(45) Date of Patent: Apr. 21, 2009

(54) SYSTEM AND METHOD FOR DETERMINING BOTH AN ESTIMATED BATTERY STATE VECTOR AND AN ESTIMATED BATTERY PARAMETER VECTOR

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 407 days.

(21) Appl. No.: 11/366,089

(22) Filed: Mar. 2, 2006

(65) Prior Publication Data

US 2007/0236182 A1 Oct. 11, 2007

(51) Int. Cl.
*H01M 10/44* (2006.01)
*H01M 10/46* (2006.01)

(52) U.S. Cl. .................................... 320/132

(58) Field of Classification Search ................. 320/132, 320/149; 324/426, 427, 430, 433
See application file for complete search history.

(56) References Cited

U.S. PATENT DOCUMENTS

| 4,390,841 | A | * | 6/1983 | Martin et al. | 324/427 |
| 6,353,815 | B1 | * | 3/2002 | Vilim et al. | 706/15 |
| 6,534,954 | B1 | * | 3/2003 | Plett | 320/132 |

* cited by examiner

*Primary Examiner*—Edward Tso
(74) *Attorney, Agent, or Firm*—Cantor Colburn LLP

(57) ABSTRACT

A system and a method for determining an estimated battery state vector and an estimated battery parameter vector are provided. The method includes determining an estimated battery parameter vector indicative of a parameter of the battery at the first predetermined time based on a plurality of predicted battery parameter vectors, a first plurality of predicted battery output vectors, and a battery output vector. The method further includes determining the estimated battery state vector indicative of a state of the battery at the first predetermined time based on a plurality of predicted battery state vectors, a second plurality of predicted battery output vectors, and the battery output vector.

28 Claims, 16 Drawing Sheets

SYSTEM AND METHOD FOR DETERMINING BOTH AN ESTIMATED BATTERY STATE VECTOR AND AN ESTIMATED BATTERY PARAMETER VECTOR

BACKGROUND OF THE INVENTION

The present application relates to a system and a method for determining an estimated battery state vector and an estimated battery parameter vector using digital filtering techniques.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding quickly varying parameters (e.g., SOC) be used to estimate how much battery energy is presently available to do work, and so forth. Further, it may be desirable to ascertain information regarding slowly varying parameters (e.g., total capacity) in order to keep the prior calculations precise over the lifetime of the pack, extending its useful service time, and help in determining the state-of-health (SOH) of the pack.

The inventor herein has recognized that other mathematical algorithms have been unable to provide a highly accurate estimate of an internal state and a parameter of a battery because they are not sufficiently optimized for batteries having non-linear operational characteristics. Since batteries generally have non-linear operational characteristics, a more accurate method is needed.

Accordingly, the inventor herein has recognized a need for a system and a method for more accurately determining an estimated battery state and an estimated battery parameter. In particular, the inventor herein has recognized a need for utilizing two coupled "filters" with combined behavior that estimates an estimated battery state and an estimated battery parameter.

BRIEF DESCRIPTION OF THE INVENTION

A method for determining an estimated battery state vector and an estimated battery parameter vector in accordance with an exemplary embodiment is provided. The estimated battery state vector is indicative of a state of a battery at a first predetermined time. The estimated battery parameter vector is indicative of a parameter of the battery at the first predetermined time. The method includes determining a plurality of estimated augmented battery state vectors that are indicative of a state of the battery, a battery input noise, a sensor noise associated with a sensor measuring a battery output variable, an uncertainty of the state of the battery, an uncertainty of the battery input noise, and an uncertainty of the sensor noise at a second predetermined time prior to the first predetermined time. The method further includes determining a plurality of predicted battery state vectors that are indicative of the state of the battery and an uncertainty of the state of the battery at the first predetermined time based on the plurality of estimated augmented battery state vectors. The method further includes determining a plurality of predicted battery parameter vectors that are indicative of the parameter of the battery and an uncertainty of the parameter of the battery at the first predetermined time. The method further includes determining a first plurality of predicted battery output vectors that are indicative of at least one output variable of the battery and an uncertainty of the output variable at the first predetermined time based on the plurality of predicted battery parameter vectors. The method further includes determining a second plurality of predicted battery output vectors that are indicative of at least one output variable of the battery and the uncertainty of the output variable at the first predetermined time based on the plurality of estimated augmented battery state vectors and the plurality of predicted battery state vectors. The method further includes determining a battery output vector having at least one measured value of a battery output variable obtained at the first predetermined time. The method further includes determining an estimated battery parameter vector indicative of the parameter of the battery at the first predetermined time based on the plurality of predicted battery parameter vectors, the first plurality of predicted battery output vectors, and the battery output vector. The method further includes determining an estimated battery state vector indicative of the state of the battery at the first predetermined time based on the plurality of predicted battery state vectors, the second plurality of predicted battery output vectors, and the battery output vector.

A system for determining an estimated battery state vector and an estimated battery parameter vector in accordance with another exemplary embodiment is provided. The estimated battery state vector is indicative of a state of a battery at a first predetermined time. The estimated battery parameter vector is indicative of a parameter of the battery at the first predetermined time. The system includes a sensor configured to generate a first signal indicative of an output variable of the battery. The system further includes a computer operably coupled to the sensor. The computer is configured to determine a plurality of estimated augmented battery state vectors that are indicative of a state of the battery, a battery input noise, a sensor noise associated with a sensor measuring a battery output variable, an uncertainty of the state of the battery, an uncertainty of the battery input noise, and an uncertainty of the sensor noise at a second predetermined time prior to the first predetermined time. The computer is further configured to determine a plurality of predicted battery state vectors that are indicative of the state of the battery and an uncertainty of the state of the battery at the first predetermined time based on the plurality of estimated augmented battery state vectors. The computer is further configured to determine a plurality of predicted battery parameter vectors that are indicative of the parameter of the battery and an uncertainty of the parameter of the battery at the first predetermined time. The computer is further configured to determine a first plurality of predicted battery output vectors that are indicative of at least one output variable of the battery and an uncertainty of the output variable at the first predetermined time based on the plurality of predicted battery parameter vectors. The computer is further configured to determine a second plurality of predicted battery output vectors that are indicative of at least one output variable of the battery and the uncertainty of the output variable at the first predetermined time based on the plurality of estimated augmented battery state vectors and the plurality of predicted battery state vectors. The computer is further configured to determine a battery output vector based on the first signal. The computer is further configured to determine an estimated battery parameter vector indicative of the parameter of the battery at the first predetermined time based on the plurality of predicted battery parameter vectors, the first plurality of predicted battery output vectors, and the battery output vector. The computer is further configured to determine an estimated battery state vector indicative of the state of the battery at the first predetermined time based on the plurality of predicted battery state vectors, the second plurality of predicted battery output vectors, and the battery output vector.

Other systems and/or methods according to the embodiments will become or are apparent to one with skill in the art upon review of the following drawings and detailed description. It is intended that all such additional systems and methods be within the scope of the present invention, and be protected by the accompanying claims.

DETAILED DESCRIPTION OF THE INVENTION

Figure 1:
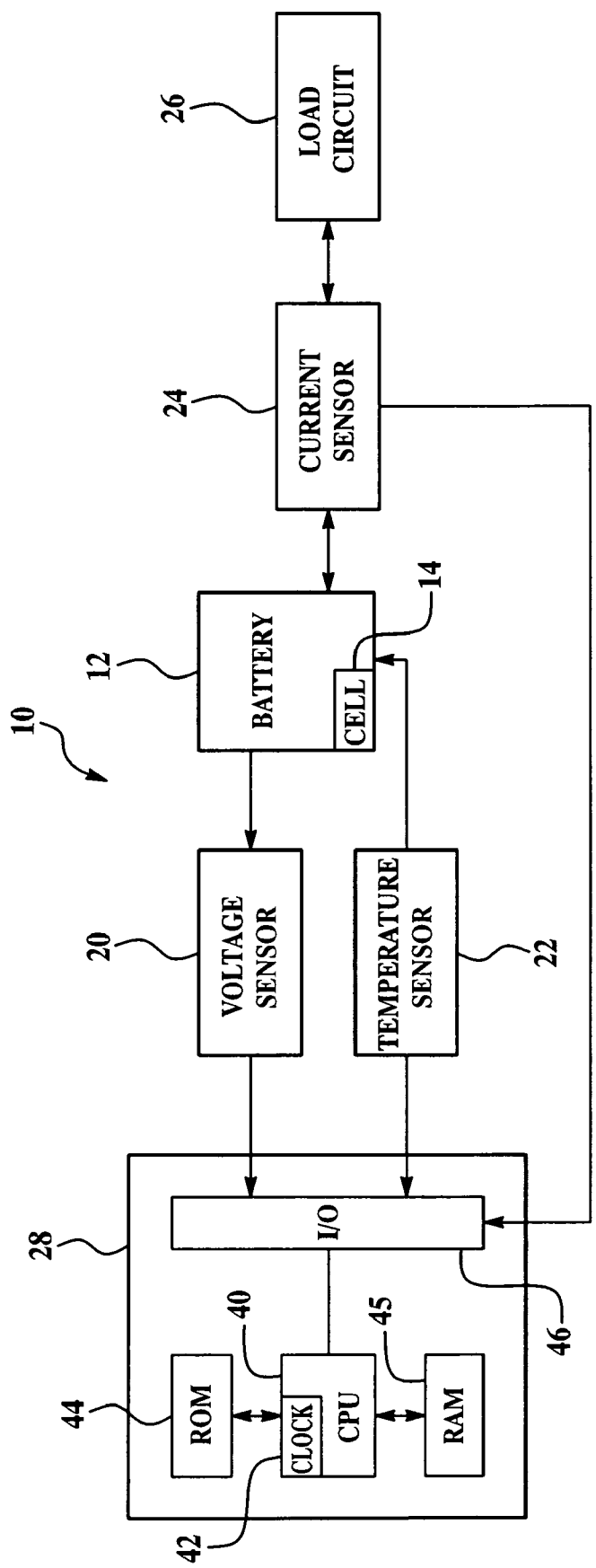
FIG. 1 is a schematic of a system for determining both an estimated battery state vector and an estimated battery parameter vector in accordance with an exemplary embodiment.
Figure 2:
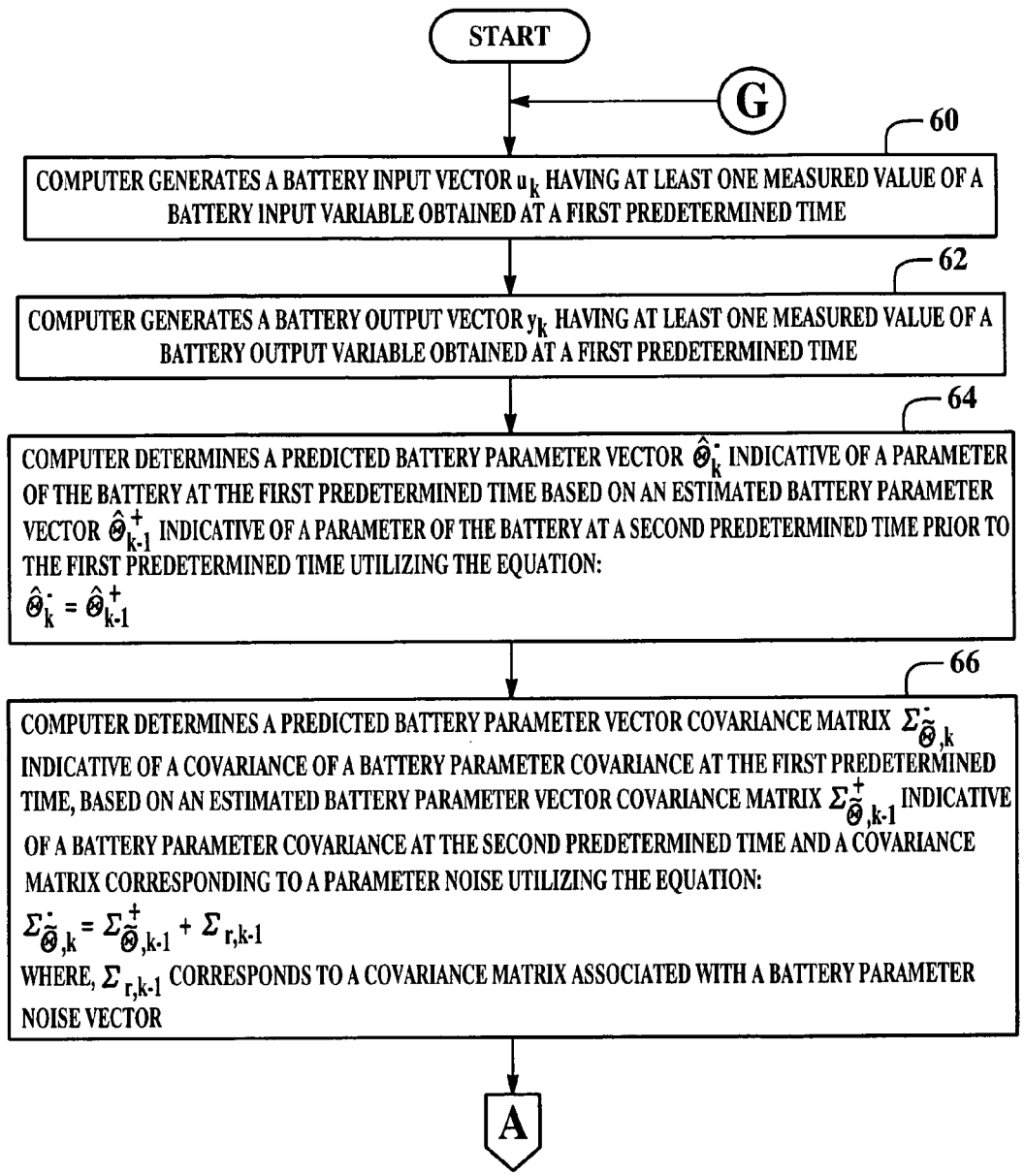
FIGS. 2-8 are flowcharts of a method for determining both an estimated battery state vector and an estimated battery parameter vector in accordance with another exemplary embodiment.
Figure 3:
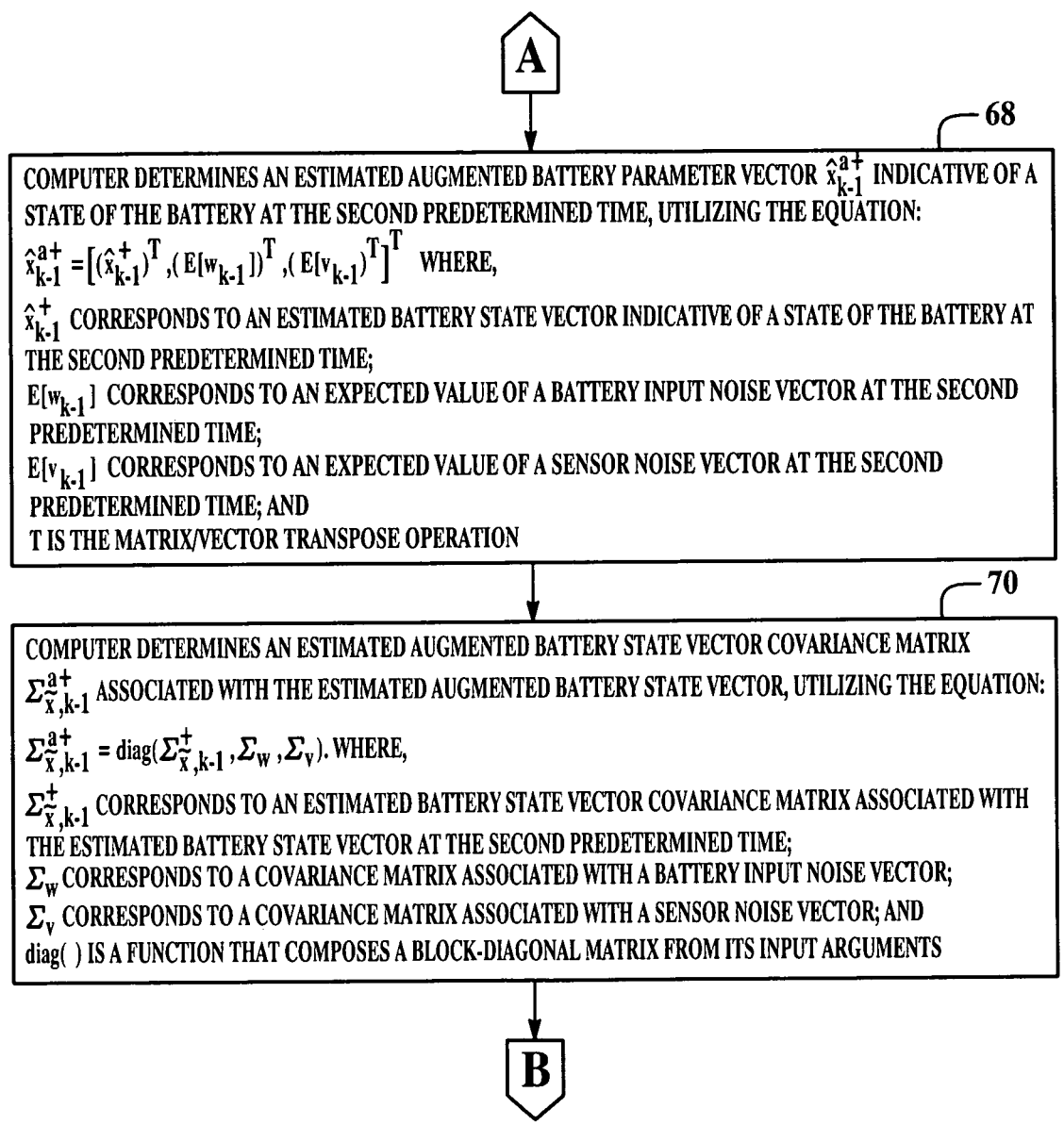
Figure 4:
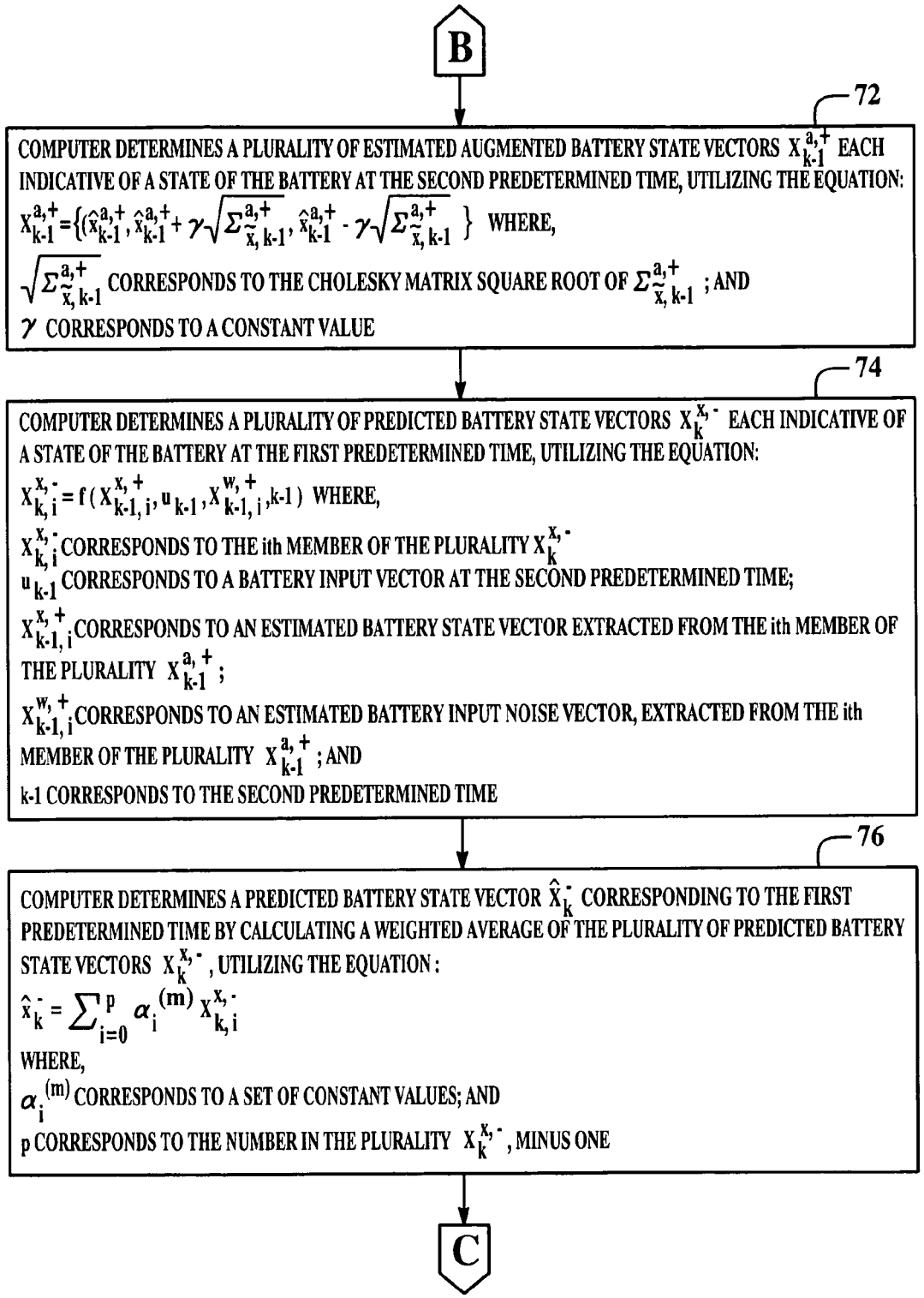
Figure 5:
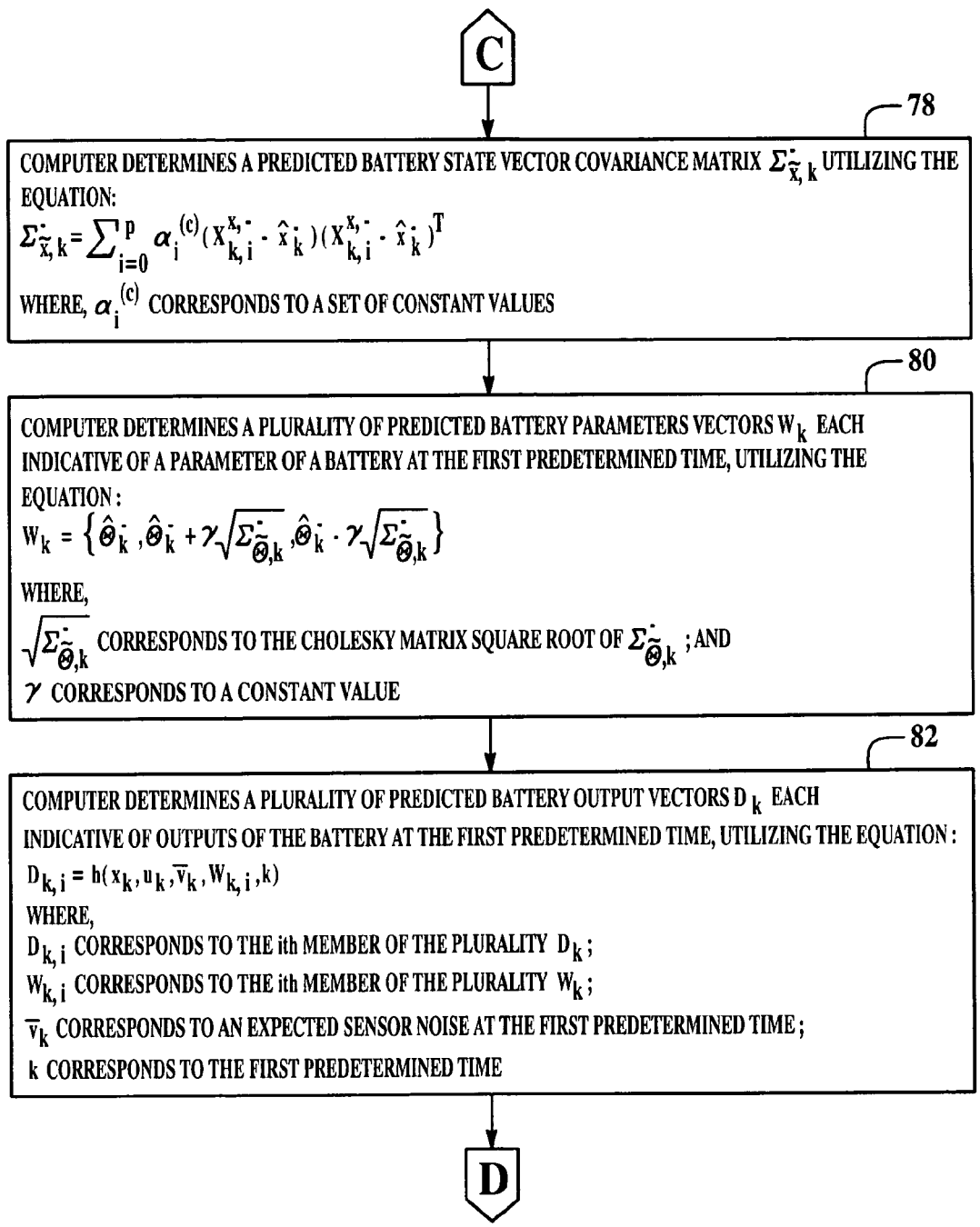
Figure 6:
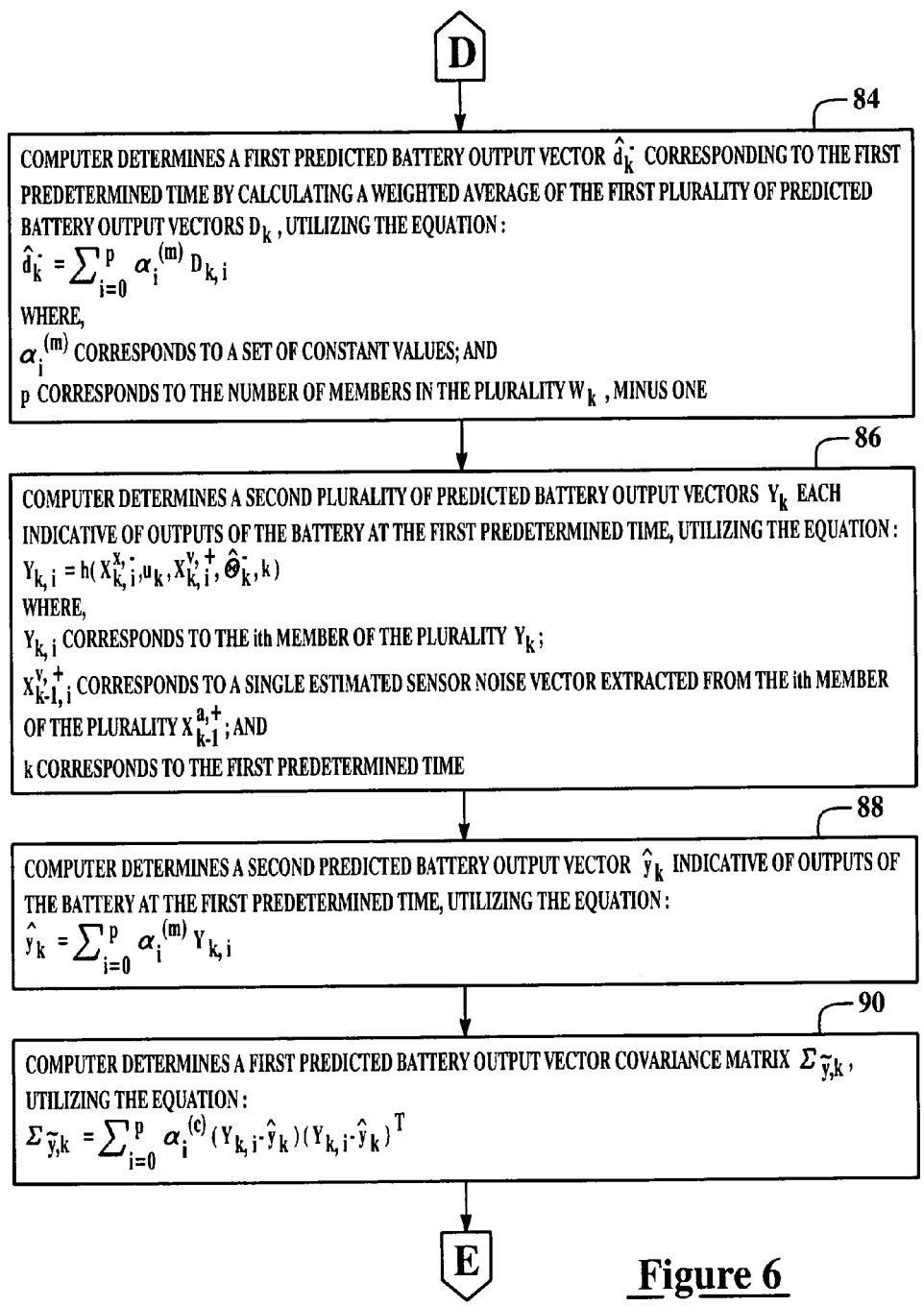
Figure 7:
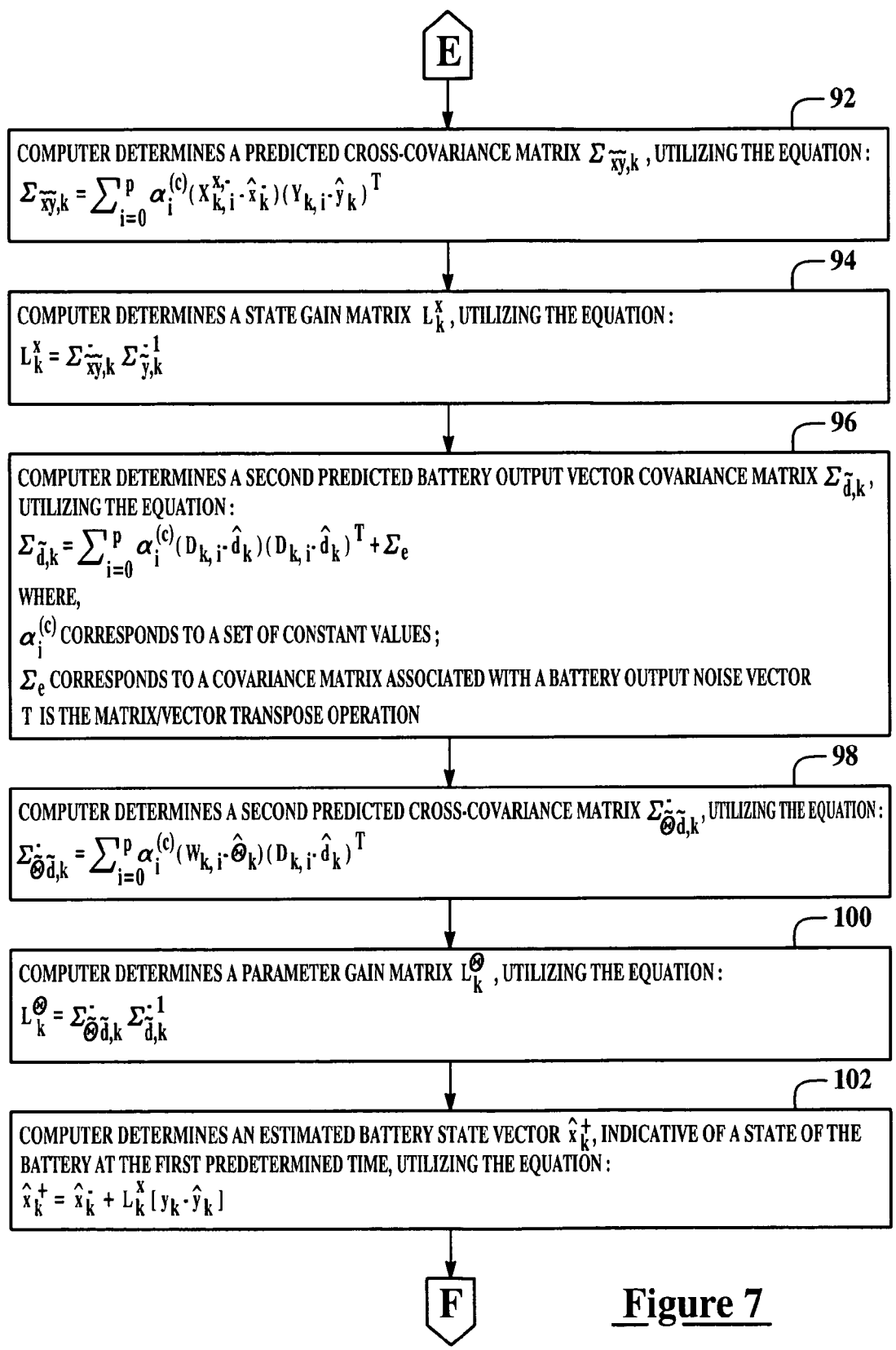
Figure 8:
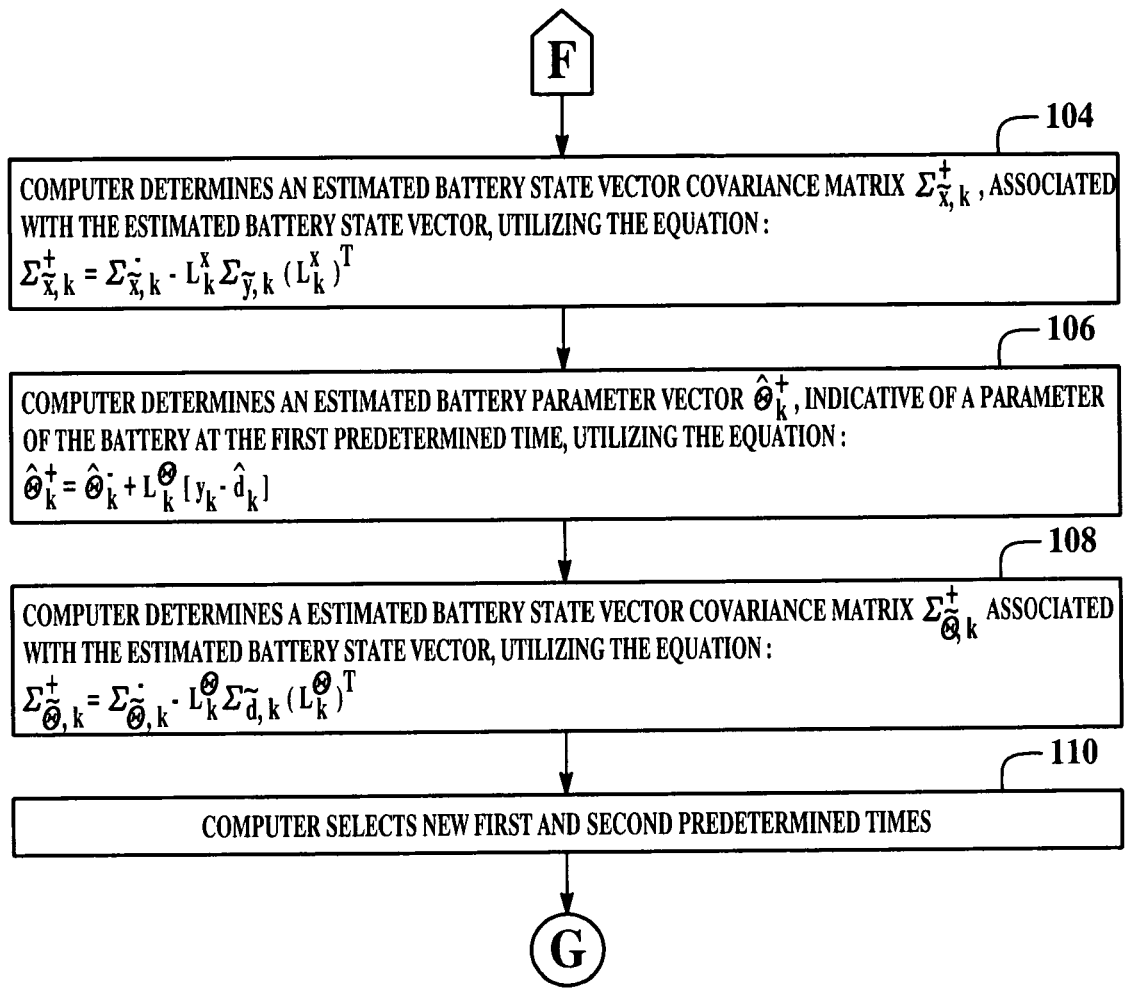
Figure 9:
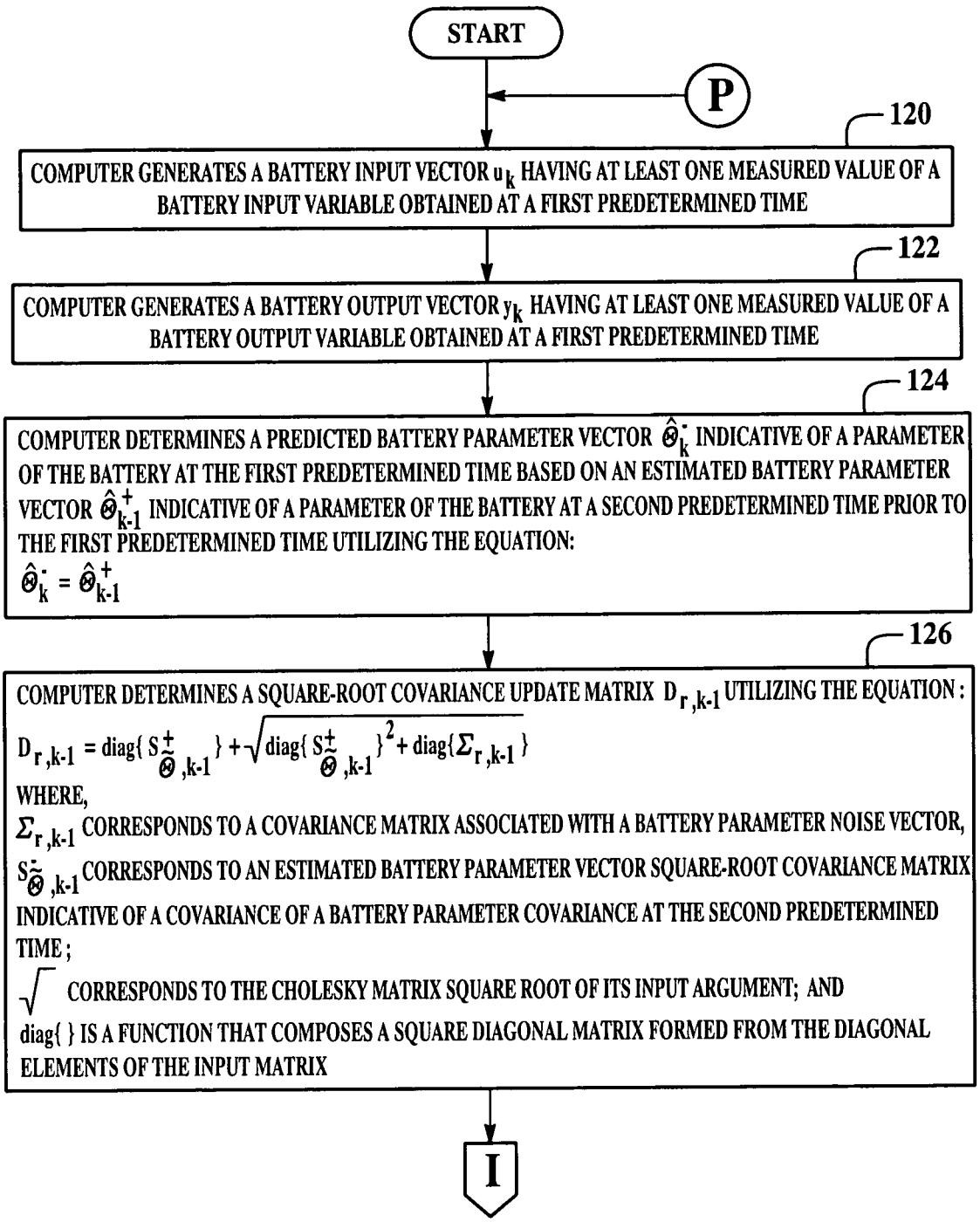
FIGS. 9-16 are flowcharts of a method for determining both an estimated battery state vector and an estimated battery parameter vector in accordance with another exemplary embodiment.
Figure 10:
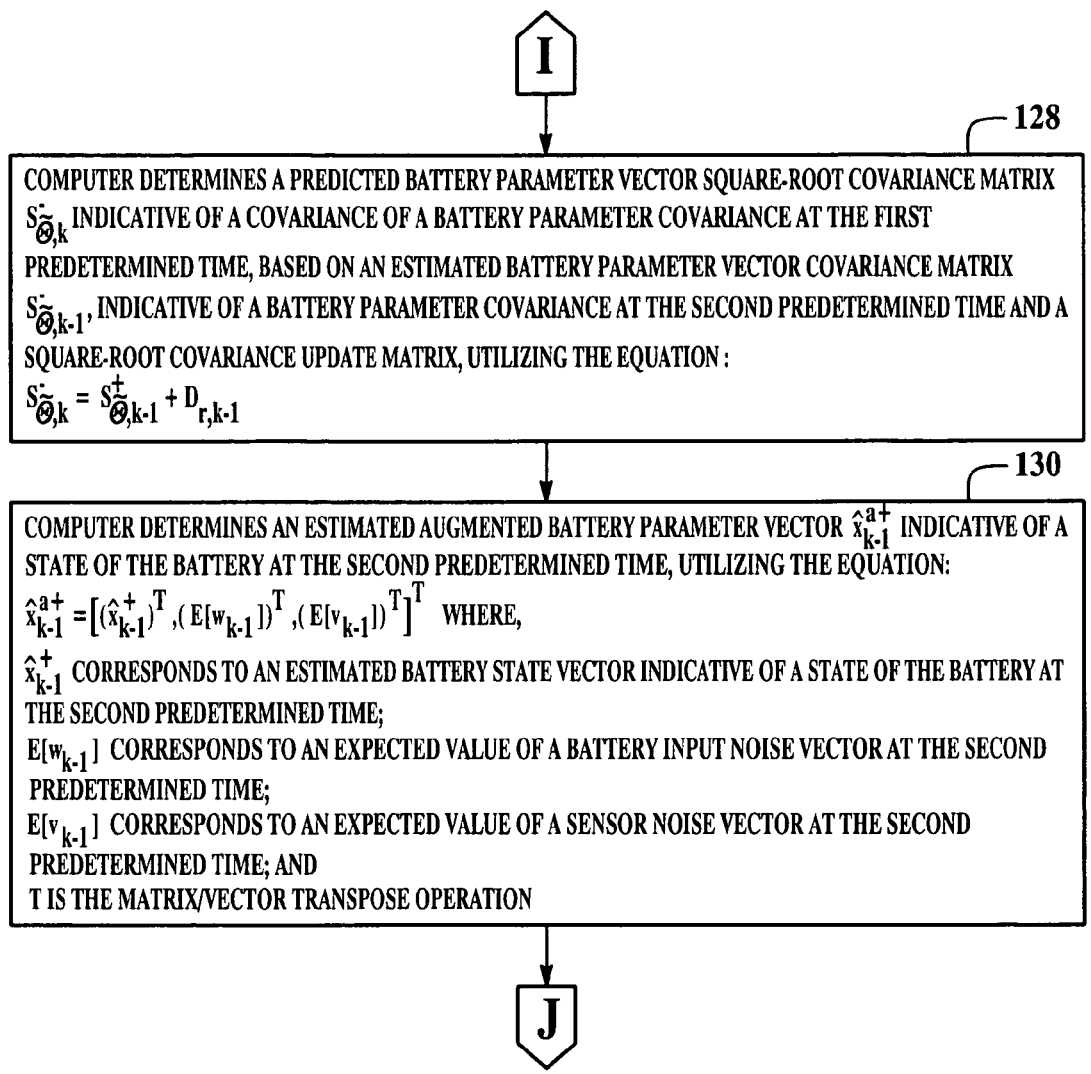
Figure 11:
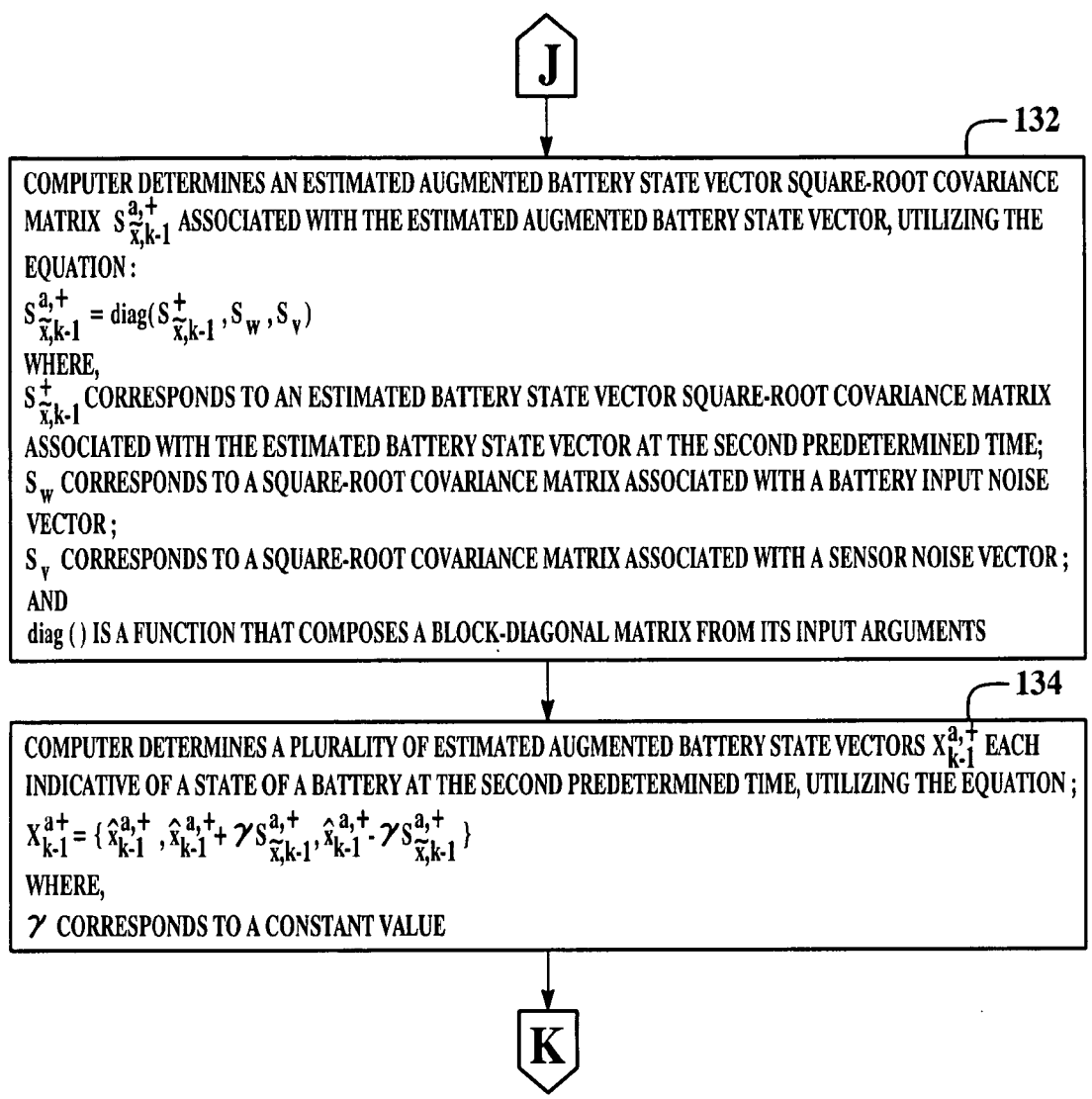
Figure 12:
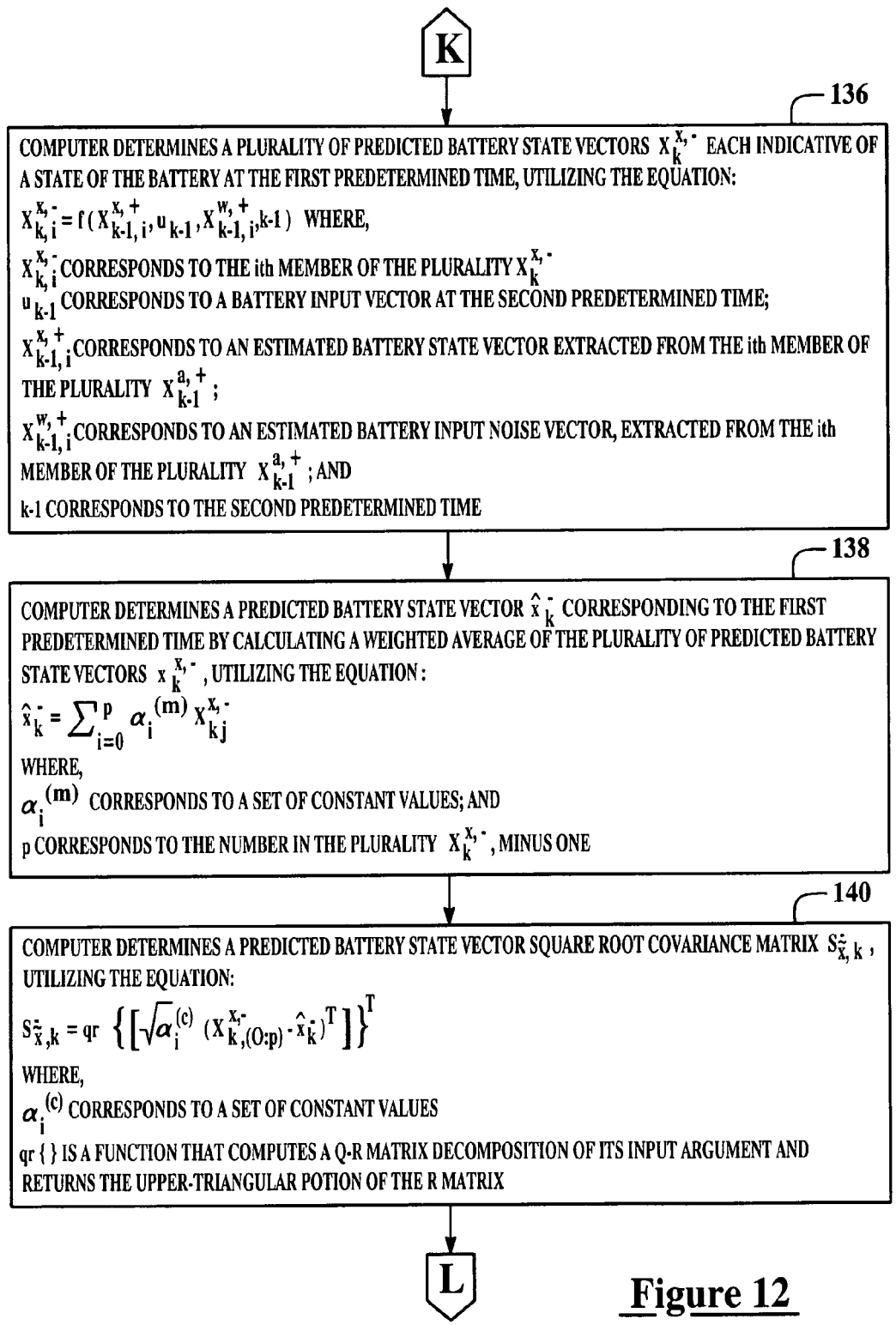
Figure 13:
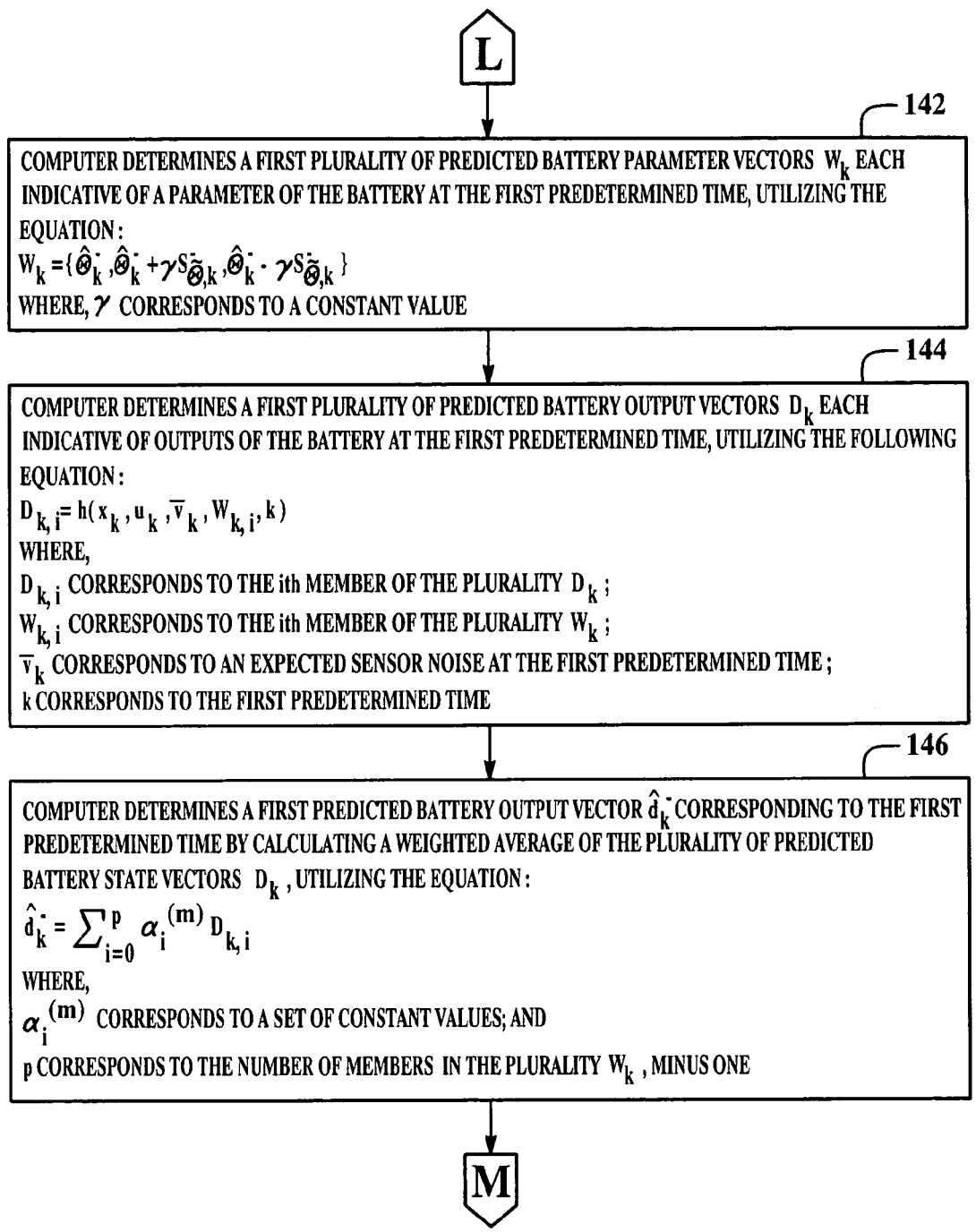
Figure 14:
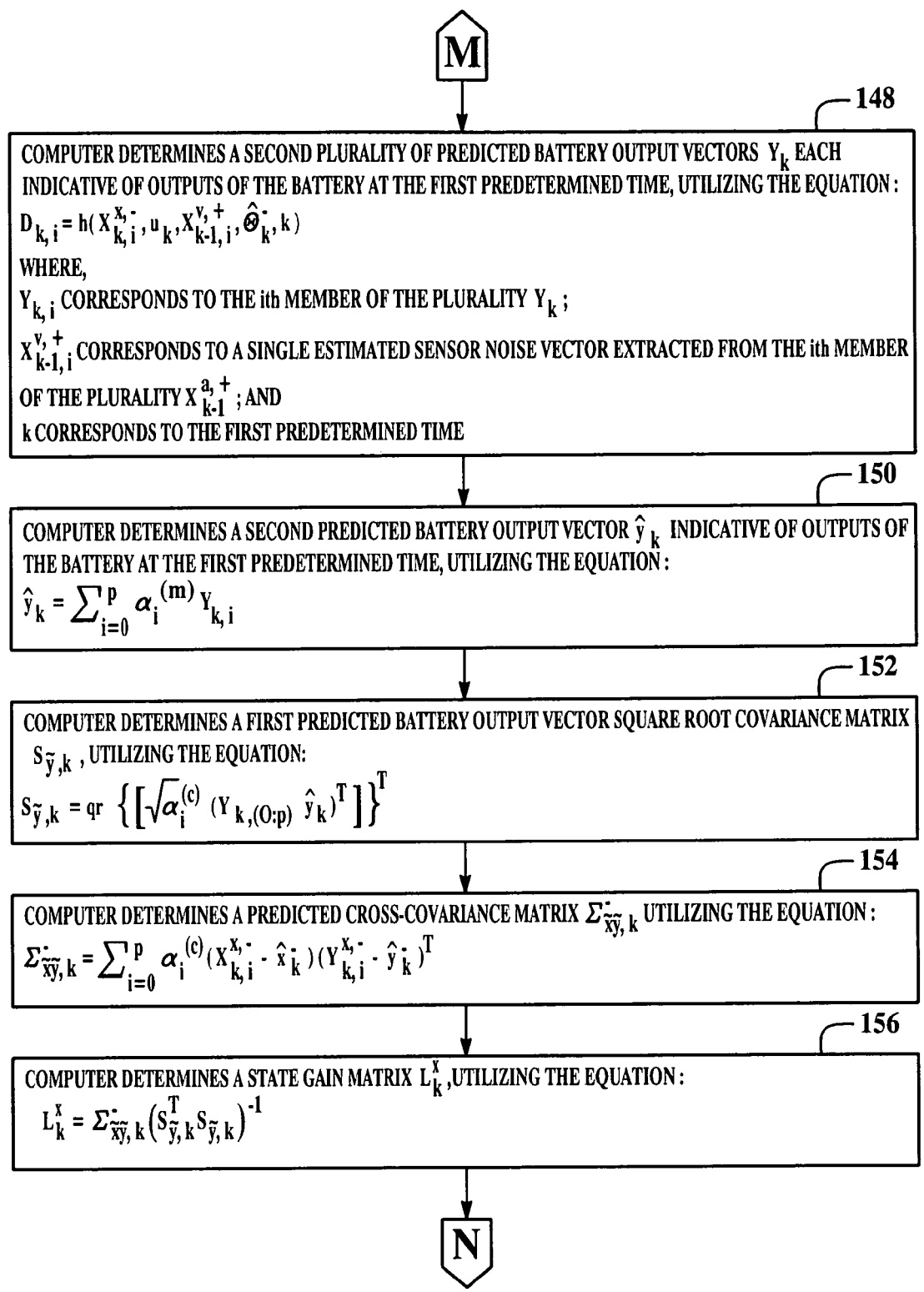
Figure 15:
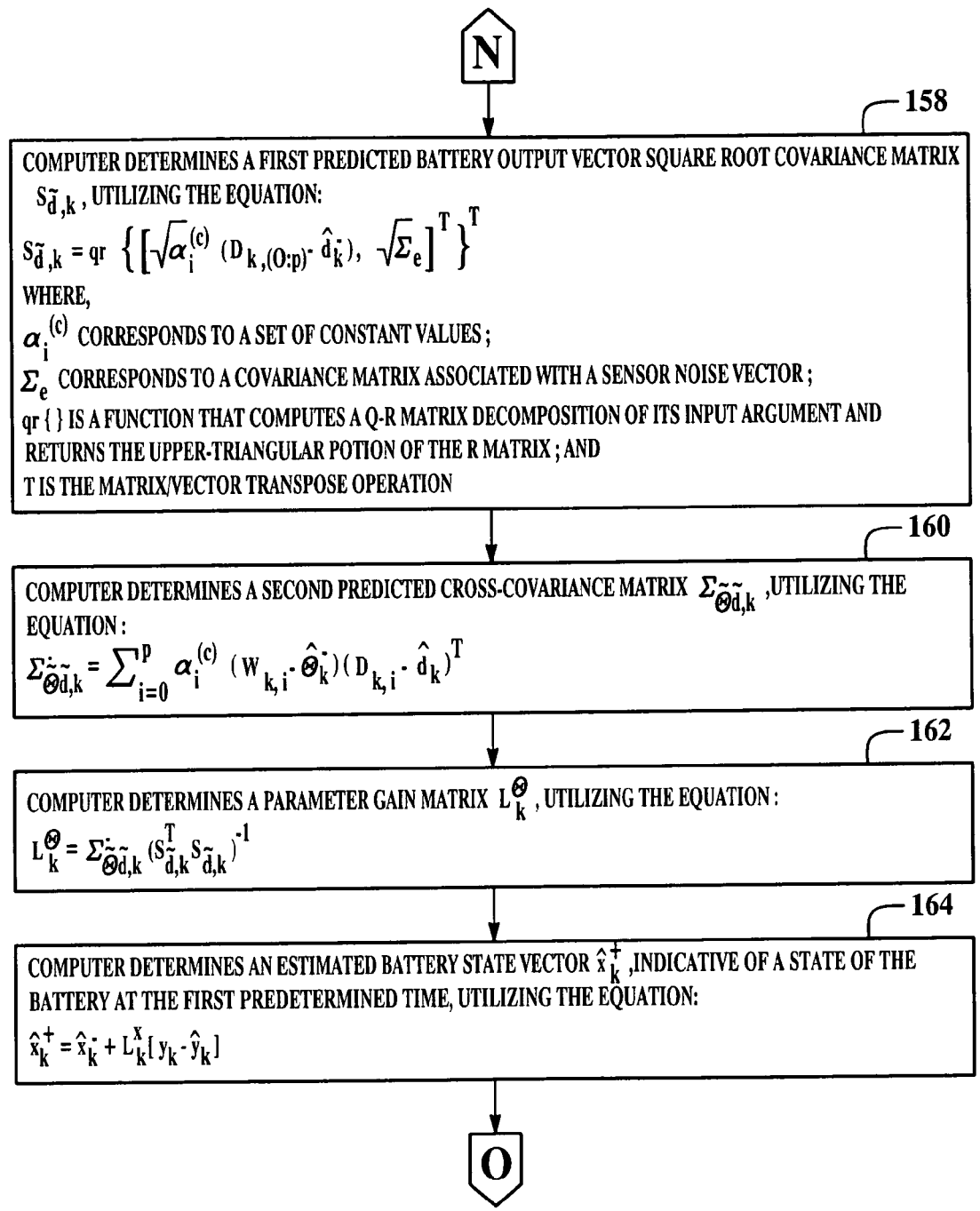
Figure 16:
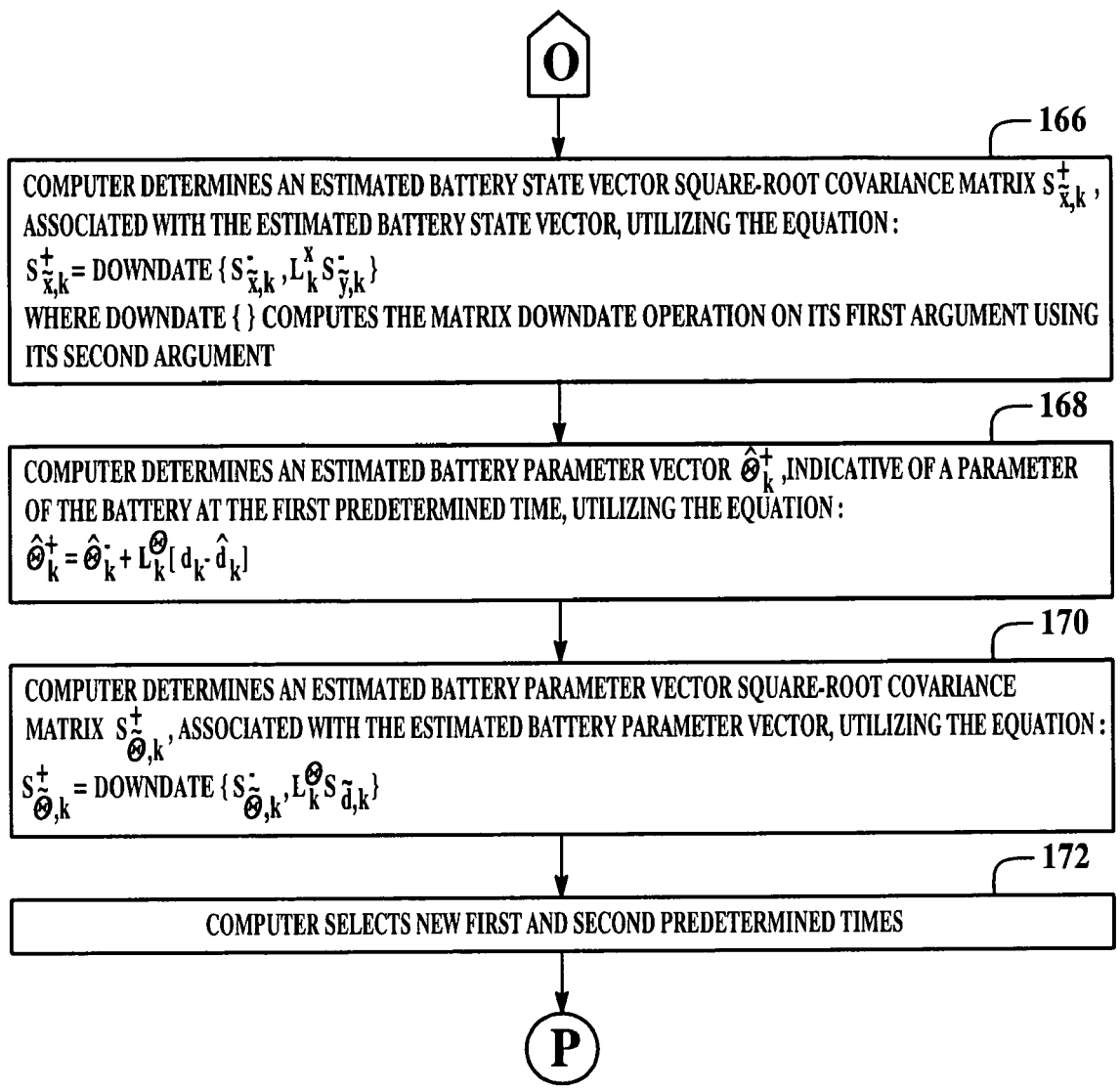

Referring to FIG. 1, a system 10 for determining both an estimated battery state vector indicative of a state of the battery 12 and an estimated battery parameter vector indicative of a parameter of the battery 12 is illustrated. The battery 12 includes at least a battery cell 14. Of course, the battery 12 can include a plurality of additional battery cells. Each battery cell can be either a rechargeable battery cell or a non-rechargeable battery cell. Further, each battery cell can be constructed using an anode and a cathode having electro-chemical configurations known to those skilled in the art.

An input variable is defined as a value of a battery input signal at a specific time. For example, an input variable can comprise one of a current entering the battery and a temperature of the battery. An output variable is defined as a value of a battery output signal at a specific time. For example, an output variable can comprise one of a battery output voltage and a battery pressure.

The system 10 includes one or more voltage sensors 20, a load circuit 26, and a computational unit such as a computer 28, and may also include one or more of a temperature sensor 22, and a current sensor 24.

The voltage sensor 20 is provided to generate a first output signal indicative of the voltage produced by one or more of the battery cells of the battery 12. The voltage sensor 20 is electrically coupled between the I/O interface 46 of the computer 28 and the battery 12. The voltage sensor 20 transfers the first output signal to the computer 28. For clarity of presentation, a single voltage sensor will be described herein. However, it should be noted that in an alternate embodiment of system 10 a plurality of voltage sensors (e.g., one voltage sensor per battery cell) are utilized in system 10.

The temperature sensor 22 is provided to generate a second output signal indicative of one or more temperatures of the battery 12. The temperature sensor 22 is disposed proximate the battery 12 and is electrically coupled to the I/O interface 46 of the computer 28. The temperature sensor 22 transfers the second output signal to the computer 28. For clarity of presentation, a single temperature sensor will be described herein. However, it should be noted that in an alternate embodiment of system 10 a plurality of temperature sensors (e.g., one temperature sensor per battery cell) are utilized in system 10.

The current sensor 24 is provided to generate a third output signal indicative of a current sourced or sunk by the battery cells of the battery 12. The current sensor 24 is electrically coupled between the battery 12 and the load circuit 26. The current sensor 24 is further electrically coupled to the I/O interface 46 of the computer 28. The current sensor 24 transfers the third output signal to the computer 28.

The load circuit 26 is electrically coupled to the current sensor 24 and sinks or sources a current from the battery 12. The load circuit 26 comprises any electrical device that can be electrically coupled to the battery 12.

The computer 28 is provided for determining both an estimated battery state vector indicative of a state of the battery 12 and an estimated battery parameter vector indicative of a parameter of the battery 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of known memory devices such as PROMs, EPROMs, EEPROMS, flash memory or any other electric, magnetic, optical or combination memory device capable of storing data, some of which represent executable instructions used by the CPU 40.

For purposes of understanding, the notation utilized in the equations of the following methods will be described. The circumflex symbol indicates an estimated or predicted quantity (e.g., $\hat{x}$ indicates an estimate of the true quantity x). The superscript symbol "−" indicates an a priori estimate (i.e., a prediction of a quantity's present value based on past data). The superscript symbol "+" indicates an a posteriori estimate (e.g., $\hat{x}_k^+$ is the estimate of true quantity x at time index k based on all measurements taken up to and including time k). The tilde symbol indicates the error of an estimated quantity (e.g., $\tilde{x}_k^- = x_k - \hat{x}_k^-$ and $\tilde{x}_k^+ = x_k - \hat{x}_k^+$). The symbol $\Sigma_{xy} = E[xy^T]$ indicates the correlation or cross correlation of the variables in its subscript (the quantities described herein are zero-mean, so the correlations are identical to covariances). The symbol $\Sigma_x$ indicates the same quantity as $\Sigma_{xx}$. The superscript "T" is a matrix/vector transpose operator.

Before providing a detailed discussion of the methodologies for determining a battery parameter vector associated with the battery 12, a general overview will be provided.

A battery state vector may include, for example, a state of charge (SOC) value associated with the battery 12, a hysteresis voltage, or a polarization voltage. The SOC value is a value from 0-100 percent that indicates a present available capacity of the battery 12 that may be used to do work.

A mathematical model of battery cell behavior is used in the method to compute an estimate of the state vector of the battery 12. It is assumed that a mathematical model of the battery cell dynamics is known, and may be expressed using a discrete-time state-space model comprising a state equation and an output equation, as will be described below.

The state equation utilized to determine the state vector associated with the battery 12 is as follows:

$$x_k = f(x_{k-1}, u_{k-1}, w_{k-1}, k-1)$$

wherein, $x_k$ is the state vector associated with the battery 12 at time index k;

$u_k$ is a variable representing a known/deterministic input to the battery 12;

$w_k$ is a battery input noise vector that models some unmeasured input which affects the state of the system; and $f(x_{k-1}, u_{k-1}, w_{k-1}, k-1)$ is a state transition function.

An output vector associated with the battery 12 is determined utilizing the following equation:

$$y_k = h(x_k, u_k, v_k, k)$$

wherein, $h(x_k, u_k, v_k, k)$ is a measurement function; and $v_k$ is sensor noise that affects the measurement of the output of battery 12 in a memory-less mode, but does not affect the state vector of battery 12.

The system state $x_k$ includes, at least, a minimum amount of information, together with the present input and a mathematical model of the cell, needed to predict the present output. For a cell 14, the state might include: SOC, polarization voltage levels with respect to different time constants, and hysteresis levels, for example. The system exogenous input $u_k$ includes at minimum the present cell current $i_k$, and may, optionally, include cell temperature (unless temperature change is itself modeled in the state). The system parameters $\theta_k$ are the values that change only slowly with time, in such a way that they may not be directly determined with knowledge of the system measured input and output. These might include, but not be limited to: cell capacity, resistance, polarization voltage time constant(s), polarization voltage blending factor(s), hysteresis blending factor(s), hysteresis rate constant(s), efficiency factor(s), and so forth. The model output $y_k$ corresponds to physically measurable cell quantities or those directly computable from measured quantities at minimum for example, the cell voltage under load.

A mathematical model of parameter dynamics is also utilized. An exemplary model has the form:

$$\theta_{k+1} = \theta_k + r_k$$

$$d_k = g(x_k, u_k, \theta_k) + e_k.$$

The first equation states that the parameters $\theta_k$ are primarily constant, but that they may change slowly over time, in this instance, modeled by a "noise" process denoted, $r_k$. The "output" $d_k$ is a function of the optimum parameter dynamics modeled by $g(.,.,.)$ plus some estimation error $e_k$. The optimum parameter dynamics $g(.,.,.)$ being a function of the system state $x_k$, an exogenous input $u_k$, and the set of time varying parameters $\theta_k$.

Referring to FIGS. 2-8, a method for determining both an estimated battery state vector and an estimated battery parameter vector associated with the battery 12 utilizing Sigma-Point Kalman filters, in accordance with an exemplary embodiment will now be explained. The method can be implemented utilizing software algorithms executed by the controller 28. The software algorithms are stored in either the ROM 44 or the RAM 45 or other computer readable mediums known to those skilled in the art.

At step 60, the computer 28 generates a battery input vector $u_k$ having at least one measured value of a battery input variable obtained at a first predetermined time.

At step 62, the computer 28 generates a battery output vector $y_k$ having at least one measured value of a battery output variable obtained at the first predetermined time.

At step 64, the computer 28 determines a predicted battery parameter vector $\hat{\theta}_k^-$, indicative of a parameter of the battery 12 at the first predetermined time based on an estimated battery parameter vector $\hat{\theta}_{k-1}^+$ indicative of a parameter of the battery 12 at a second predetermined time prior to the first predetermined time utilizing the equation:

$$\hat{\theta}_k^- = \hat{\theta}_{k-1}^+.$$

At step 66, the computer 28 determines a predicted battery parameter vector covariance matrix $$\Sigma_{\tilde{\theta},k}^-$$

indicative of a covariance of a battery parameter covariance at the first predetermined time, based on an estimated battery parameter vector covariance matrix $$\Sigma_{\tilde{\theta},k-1}^+,$$

indicative of a battery parameter covariance at the second predetermined time and a covariance matrix corresponding to a parameter noise utilizing the equation:

$$\Sigma_{\tilde{\theta},k}^- = \Sigma_{\tilde{\theta},k-1}^+ + \Sigma_{r,k-1}$$

where $\Sigma_{r,k-1}$ corresponds to a covariance matrix associated with a battery parameter noise vector.

At step 68, the computer 28 determines an estimated augmented battery state vector $\hat{x}_{k-1}^{a,+}$, indicative of a state of the battery 12 at the second predetermined time, utilizing the equation:

$$\hat{x}_{k-1}^{a,+} = [(\hat{x}_{k-1}^+)^T, (E[w_{k-1}])^T, (E[v_{k-1}])^T]^T$$

where, $\hat{x}_{k-1}^+$ corresponds to an estimated battery state vector indicative of a state of the battery at the second predetermined time;

$E[w_{k-1}]$ corresponds to an expected value of a battery input noise vector at the second predetermined time;

$E[v_{k-1}]$ corresponds to an expected value of a sensor noise vector at the second predetermined time; and T is the matrix/vector transpose operation.

At step 70, the computer 28 determines an estimated augmented battery state vector covariance matrix $$\Sigma_{\tilde{x},k-1}^{a,+}$$

associated with the estimated augmented battery state vector, utilizing the equation:

$$\Sigma_{\tilde{x},k-1}^{a,+} = diag(\Sigma_{\tilde{x},k-1}^{+}, \Sigma_w, \Sigma_v)$$

where, $$\Sigma_{\tilde{x},k-1}^{+}$$

corresponds to an estimated battery state vector covariance matrix associated with the estimated battery state vector at the second predetermined time;
$\Sigma_w$ corresponds to a covariance matrix associated with a battery input noise vector;
$\Sigma_v$ corresponds to a covariance matrix associated with a sensor noise vector; and
diag( ) is a function that composes a block-diagonal matrix from its input arguments.

At step 72, the computer 28 determines a plurality of estimated augmented battery state vectors $X_{k-1}^{a,+}$ each indicative of a state of a battery 12 at the second predetermined time, utilizing the equation:

$$X_{k-1}^{a,+} = \{\hat{x}_{k-1}^{a,+}, \hat{x}_{k-1}^{a,+} + \gamma\sqrt{\Sigma_{\tilde{x},k-1}^{a,+}}, \hat{x}_{k-1}^{a,+} - \gamma\sqrt{\Sigma_{\tilde{x},k-1}^{a,+}}\}$$

where, $$\sqrt{\Sigma_{\tilde{x},k-1}^{a,+}}$$

corresponds to the Cholesky matrix square root of $\Sigma_{\tilde{x},k-1}^{a,+}$; and
$\gamma$ corresponds to a constant value.

At step 74, the computer 28 determines a plurality of predicted battery state vectors $X_k^{x,-}$ each indicative of a state of the battery 12 at the first predetermined time, utilizing the equation:

$$X_{k,j}^{x,-} = f(X_{k-1,j}^{x,+}, u_{k-1}, X_{k-1,j}^{w,+}, k-1)$$

where,
$X_{k,j}^{x,-}$ corresponds to the ith member of the plurality $X_k^{x,-}$
$u_{k-1}$ corresponds to a battery input vector at the second predetermined time;
$X_{k-1,j}^{x,+}$ corresponds to an estimated battery state vector extracted from the ith member of the plurality $X_{k-1}^{a,+}$;
$X_{k-1,j}^{w,+}$ corresponds to an estimated battery input noise vector, extracted from the ith member of the plurality $X_{k-1}^{a,+}$; and
k−1 corresponds to the second predetermined time.

At step 76, the computer 28 determines a predicted battery state vector $\hat{x}_k^-$ corresponding to the first predetermined time by calculating a weighted average of the plurality of predicted battery state vectors $X_k^{x,-}$, utilizing the equation:

$$\hat{x}_k^- = \sum_{i=0}^{p} \alpha_i^{(m)} X_{k,i}^{x,-}$$

where,
$\alpha_i^{(m)}$ corresponds to a set of constant values; and
p corresponds to the number of members in the plurality $X_k^{x,-}$, minus one.

At step 78, the computer 28 determines a predicted battery state vector covariance matrix $$\Sigma_{\tilde{x},k}^-,$$

utilizing the equation:

$$\Sigma_{\tilde{x},k}^- \sum_{i=0}^{p} \alpha_i^{(c)} (X_{k,i}^{x,-} - \hat{x}_k^-)(X_{k,i}^{x,-} - \hat{x}_k^-)^T$$

where, $\alpha_i^{(c)}$ corresponds to a set of constant values.

At step 80, the computer 28 determines a plurality of predicted battery parameter vectors $W_k$ each indicative of a parameter of a battery 12 at the first predetermined time, utilizing the equation:

$$W_k = \{\hat{\theta}_k^-, \hat{\theta}_k^- + \gamma\sqrt{\Sigma_{\tilde{\theta},k}^-}, \hat{\theta}_k^- - \gamma\sqrt{\Sigma_{\tilde{\theta},k}^-}\}$$

where, $$\sqrt{\Sigma_{\tilde{\theta},k}^-}$$

corresponds to the Cholesky matrix square root of $\Sigma_{\tilde{\theta},k}^-$; and
$\gamma$ corresponds to a constant value.

At step 82, the computer 28 determines a first plurality of predicted battery output vectors $D_k$ each indicative of outputs of the battery 12 at the first predetermined time, utilizing the equation:

$$D_{k,j} = h(x_k, u_k, \bar{v}_k, W_{k,j}, k)$$

where,
$D_{k,j}$ corresponds to the ith member of the plurality $D_k$;
$W_{k,j}$ corresponds to the ith member of the plurality $W_k$;
$\bar{v}_k$ corresponds to an expected sensor noise at the first predetermined time; and
k corresponds to the first predetermined time.

At step 84, the computer 28 determines a first predicted battery output vector $\hat{d}_k^-$ corresponding to the first predetermined time by calculating a weighted average of the first plurality of predicted battery output vectors $D_k$, utilizing the equation:

$$\hat{d}_k^- = \sum_{i=0}^{p} \alpha_i^{(m)} D_{k,i}$$

where,
$\alpha_i^{(m)}$ corresponds to a set of constant values; and
p corresponds to the number of members in the plurality $W_k$, minus one At step 86, the computer 28 determines a second plurality of predicted battery output vectors $Y_k$ each indicative of outputs of the battery 12 at the first predetermined time, utilizing the equation:

$$Y_{k,i} = h(X_{k,i}^{x,-}, u_k, X_{k-1,i}^{v,+}, \hat{\theta}_k^-, k)$$

where, $Y_{k,i}$ corresponds to the ith member of the plurality $Y_k$;

$X_{k-1,i}^{v,+}$ corresponds to a single estimated sensor noise vector extracted from the ith member of the plurality $X_{k-1}^{a,+}$; and k corresponds to the first predetermined time.

At step 88, the computer 28 determines a second predicted battery output vector $\hat{y}_k$ indicative of outputs of the battery 12 at the first predetermined time, utilizing the equation:

$$\hat{y}_k = \sum_{i=0}^{p} \alpha_i^{(m)} Y_{k,i}.$$

At step 90, the computer 28 determines a first predicted battery output vector covariance matrix $\Sigma_{\tilde{y},k}^-$, utilizing the equation:

$$\Sigma_{\tilde{y},k} = \sum_{i=0}^{p} \alpha_i^{(c)} (Y_{k,i} - \hat{y}_k)(Y_{k,i} - \hat{y}_k)^T.$$

At step 92, the computer 28 determines a predicted cross-covariance matrix $$\Sigma_{\tilde{x}\tilde{y},k}^-,$$

utilizing the equation:

$$\Sigma_{\tilde{x}\tilde{y},k}^- = \sum_{i=0}^{p} \alpha_i^{(c)} (X_{k,i}^{x,-} - \hat{x}_k^-)(Y_{k,i} - \hat{y}_k)^T.$$

At step 94, the computer 28 determines a state gain matrix $L_k^x$, utilizing the equation:

$$L_k^x = \Sigma_{\tilde{x}\tilde{y},k}^- \Sigma_{\tilde{y},k}^{-1}.$$

At step 96, the computer 28 determines a second predicted battery output vector covariance matrix $\Sigma_{\tilde{d},k}$, utilizing the equation:

$$\Sigma_{\tilde{d},k} = \sum_{i=0}^{p} \alpha_i^{(c)} (D_{k,i} - \hat{d}_k)(D_{k,i} - \hat{d}_k)^T + \Sigma_e$$

where, $\alpha_i^{(c)}$ corresponds to a set of constant values;

$\Sigma_e$ corresponds to a covariance matrix associated with a battery output noise vector.

T is the matrix/vector transpose operation.

At step 98, the computer 28 determines a predicted cross-covariance matrix $$\Sigma_{\tilde{\theta}\tilde{d},k}^-,$$

utilizing the equation:

$$\Sigma_{\tilde{\theta}\tilde{d},k}^- = \sum_{i=0}^{p} \alpha_i^{(c)} (W_{k,i} - \hat{\theta}_k^-)(D_{k,i} - \hat{d}_k)^T.$$

At step 100, the computer 28 determines a parameter gain matrix $L_k^\theta$, utilizing the equation:

$$L_k^\theta = \Sigma_{\tilde{\theta}\tilde{d},k}^- \Sigma_{\tilde{d},k}^{-1}.$$

At step 102, the computer 28 determines an estimated battery state vector $\hat{x}_k^+$, indicative of a state of the battery 12 at the first predetermined time, utilizing the equation:

$$\hat{x}_k^+ = \hat{x}_k^- + L_k^x [y_k - \hat{y}_k].$$

At step 104, the computer 28 determines an estimated battery state vector covariance matrix $\Sigma_{\tilde{x},k}^+$, associated with the estimated battery state vector, utilizing the equation:

$$\Sigma_{\tilde{x},k}^+ = \Sigma_{\tilde{x},k}^- - L_k^x \Sigma_{\tilde{y},k} (L_k^x)^T.$$

At step 106, the computer 28 determines an estimated battery parameter vector $\hat{\theta}_k^+$, indicative of a parameter of the battery 12 at the first predetermined time, utilizing the equation:

$$\hat{\theta}_k^+ = \hat{\theta}_k^- + L_k^\theta [y_k - \hat{d}_k].$$

At step 108, the computer 28 determines an estimated battery parameter vector covariance matrix $\Sigma_{\tilde{\theta},k}^+$, associated with the estimated battery parameter vector, utilizing the equation:

$$\Sigma_{\tilde{\theta},k}^+ = \Sigma_{\tilde{\theta},k}^- - L_k^\theta \Sigma_{\tilde{d},k} (L_k^\theta)^T.$$

At step 110, the computer 28 selects new first and second predetermined times. After step 108, the method returns to step 60.

Referring to FIGS. 9-16, a method for determining both an estimated battery state vector and an estimated battery parameter vector associated with the battery 12 utilizing Square-Root Sigma-Point Kalman filters, in accordance with another exemplary embodiment will now be explained. The method can be implemented utilizing software algorithms executed by the controller 28. The software algorithms are stored in either the ROM 44 or the RAM 45 or other computer readable mediums known to those skilled in the art.

At step 120, the computer 28 generates a battery input vector $u_k$ having at least one measured value of a battery input variable obtained at a first predetermined time.

At step 122, the computer 28 generates a battery output vector $y_k$ having at least one measured value of a battery output variable obtained at the first predetermined time.

At step 124, the computer 28 determines a predicted battery parameter vector $\hat{\theta}_k^-$, indicative of a parameter of the battery at the first predetermined time based on an estimated battery parameter vector $\hat{\theta}_{k-1}^+$ indicative of a parameter of the battery 12 at a second predetermined time prior to the first predetermined time, utilizing the equation:

$$\hat{\theta}_k^- = \hat{\theta}_{k-1}^+.$$

At step 126, the computer 28 determines a square-root covariance update matrix $D_{r,k-1}$, utilizing the equation:

$$D_{r,k-1} = -\text{diag}\{S_{\tilde{\theta},k-1}^+\} + \sqrt{\text{diag}\{S_{\tilde{\theta},k-1}^+\}^2 + \text{diag}\{\Sigma_{r,k-1}\}}$$

where, $\Sigma_{r,k-1}$ corresponds to a covariance matrix associated with a battery parameter noise vector;

$S_{\tilde{\theta},k-1}^-$ corresponds to an estimated battery parameter vector square-root covariance matrix indicative of a covariance of a battery parameter covariance at the second predetermined time;

$\sqrt{\phantom{x}}$ corresponds to the Cholesky matrix square root of its input argument; and diag{ } is a function that composes a square diagonal matrix formed from the diagonal elements of the input matrix.

At step 128, the computer 28 determines a predicted battery parameter vector square-root covariance matrix $S_{\tilde{\theta},k}^-$ indicative of a covariance of a battery parameter covariance at the first predetermined time, based on an estimated battery parameter vector covariance matrix $S_{\tilde{\theta},k-1}^+$, indicative of a battery parameter covariance at the second predetermined time and a square-root covariance update matrix, utilizing the equation:

$$S_{\tilde{\theta},k}^- = S_{\tilde{\theta},k-1}^+ + D_{r,k-1}.$$

At step 130, the computer 28 determines an estimated augmented battery state vector $\hat{x}_{k-1}^{a,+}$, indicative of a state of the battery 12 at the second predetermined time using the equation:

$$\hat{x}_{k-1}^{a,+} = [(\hat{x}_{k-1}^+)^T, (E[w_{k-1}])^T, (E[v_{k-1}])^T]^T$$

where, $\hat{x}_{k-1}^+$ corresponds to an estimated battery state vector indicative of a state of the battery 12 at the second predetermined time;

$E[w_{k-1}]$ corresponds to an expected value of a battery input noise vector at the second predetermined time;

$E[v_{k-1}]$ corresponds to an expected value of a sensor noise vector at the second predetermined time; and T is the matrix/vector transpose operation.

At step 132, the computer 28 determines an estimated augmented battery state vector square-root covariance matrix $S_{x,k-1}^{a,+}$ associated with the estimated augmented battery state vector, utilizing the equation:

$$S_{x,k-1}^{a,+} = \text{diag}(S_{x,k-1}^+, S_w, S_v)$$

where, $S_{xk-1}^+$ corresponds to an estimated battery state vector square-root covariance matrix associated with the estimated battery state vector at the second predetermined time;

$S_w$ corresponds to a square-root covariance matrix associated with a battery input noise vector;

$S_v$ corresponds to a square-root covariance matrix associated with a sensor noise vector; and diag( ) is a function that composes a block-diagonal matrix from its input arguments.

At step 134, the computer 28 determines a plurality of estimated augmented battery state vectors $X_{k-1}^{a,+}$ each indicative of a state of a battery 12 at the second predetermined time, utilizing the equation:

$$X_{k-1}^{a,+} = \{\hat{x}_{k-1}^{a,+}, \hat{x}_{k-1}^{a,+} + \gamma S_{x,k-1}^{a,+}, \hat{x}_{k-1}^{a,+} - \gamma S_{x,k-1}^{a,+}\}$$

where $\gamma$ corresponds to a constant value.

At step 136, the computer 28 determines a plurality of predicted battery state vectors $X_k^{x,-}$ each indicative of a state of the battery 12 at the first predetermined time, utilizing the equation:

$$X_{kj}^{x,-} = f(X_{k-1j}^{x,+}, u_{k-1}, X_{k-1j}^{w,+}, k-1)$$

where, $X_{kj}^{x,-}$ corresponds to the ith member of the plurality $X_k^{x,-}$;

$u_{k-1}$ corresponds to a battery input vector at the second predetermined time;

$X_{k-1j}^{x,+}$ corresponds to an estimated battery state vector extracted from the ith member of the plurality $X_{k-1}^{a,+}$;

$X_{k-1j}^{w,+}$ corresponds to an estimated battery input noise vector, extracted from the ith member of the plurality $X_{k-1}^{a,+}$; and k−1 corresponds to the second predetermined time.

At step 138, the computer 28 determines a predicted battery state vector $\hat{x}_k^-$ corresponding to the first predetermined time by calculating a weighted average of the plurality of predicted battery state vectors $X_k^{x,-}$, utilizing the equation:

$$\hat{x}_k^- = \sum_{i=0}^{p} \alpha_i^{(m)} X_{k,i}^{x,-}$$

where, $\alpha_i^{(m)}$ corresponds to a set of constant values; and p corresponds to the number of members in the plurality $X_k^{x,-}$, minus one.

At step 140, the computer 28 determines a predicted battery state vector square-root covariance matrix $S_{x,k}^-$, utilizing the equation:

$$S_{x,k}^- = qr\{[\sqrt{\alpha_i^{(c)}}(X_{k,(0:p)}^{x,-} - \hat{x}_k^-)^T]\}^T.$$

where $\alpha_i^{(c)}$ corresponds to a set of constant values; and qr{ } is a function that computes a Q-R matrix decomposition of its input argument and returns the upper-triangular portion of the R matrix At step 142, the computer 28 determines a plurality of predicted battery parameter vectors $W_k$ each indicative of a parameter of a battery 12 at the first predetermined time, utilizing the equation:

$$W_k = \{\hat{\theta}_k^-, \hat{\theta}_k^- + \gamma S_{\tilde{\theta},k}^-, \hat{\theta}_k^- - \gamma S_{\tilde{\theta},k}^-\}$$

where $\gamma$ corresponds to a constant value.

At step 144, the computer 28 determines a first plurality of predicted battery output vectors $D_k$ each indicative of outputs of the battery 12 at the first predetermined time, utilizing the following equation:

$$D_{kj} = h(x_k, u_k, \bar{v}_k, W_{kj}, k)$$

where, $D_{kj}$ corresponds to the ith member of the plurality $D_k$;

$W_{kj}$ corresponds to the ith member of the plurality $W_k$;

$\bar{v}_k$ corresponds to an expected sensor noise at the first predetermined time;

k corresponds to the first predetermined time.

At step 146, the computer 28 determines a first predicted battery output vector $\hat{d}_k^-$ corresponding to the first predetermined time by calculating a weighted average of the first plurality of predicted battery state vectors $D_k$, utilizing the equation:

$$\hat{d}_k^- = \sum_{i=0}^{p} \alpha_i^{(m)} D_{k,j}$$

where, $\alpha$hd $i^{(m)}$ corresponds to a set of constant values; and p corresponds to the number of members in the plurality $W_k$, minus one.

At step 148, the computer 28 determines a second plurality of predicted battery output vectors $Y_k$ each indicative of outputs of the battery 12 at the first predetermined time, utilizing the equation:

$$Y_{k,i} = h(X_{k,i}^{x,-}, u_k, X_{k-1}^{v,+}, \hat{\theta}_k^-, k)$$

where, $Y_{kj}$ corresponds to the ith member of the plurality $Y_k$;

$X_{k-1,j}^{v,+}$ corresponds to a single estimated sensor noise vector extracted from the ith member of the plurality $X_{k-1}^{a,+}$; and k corresponds to the first predetermined time.

At step 150, the computer 28 determines a second predicted battery output vector $\hat{y}_k$ indicative of outputs of the battery 12 at the first predetermined time, utilizing the equation:

$$\hat{y}_k = \sum_{i=0}^{p} \alpha_i^{(m)} Y_{k,i}.$$

At step 152, the computer 28 determines a first predicted battery output vector square-root covariance matrix $S_{\tilde{y},k}$, utilizing the equation:

$$S_{\tilde{y},k} = qr\{[\sqrt{\alpha_i^{(c)}}(Y_{k,(0:p)} - \hat{y}_k)^T]\}^T.$$

At step 154, the computer 28 determines a predicted cross-covariance matrix $\Sigma_{\tilde{xy},k}^-$, utilizing the equation:

$$\Sigma_{\tilde{xy},k}^- = \sum_{i=0}^{p} \alpha_i^{(c)} (X_{k,i}^{x,-} - \hat{x}_k^-)(Y_{k,i} - \hat{y}_k)^T.$$

At step 156, the computer 28 determines a state gain matrix $L_k^x$, utilizing the equation:

$$L_k^x = \Sigma_{\tilde{xy},k}^- (S_{\tilde{y},k}^T S_{\tilde{y},k})^{-1}.$$

At step 158, the computer 28 determines a predicted battery output vector square-root covariance matrix $S_{\tilde{d},k}$, utilizing the equation:

$$S_{\tilde{d},k} = qr\{[\sqrt{\alpha_i^{(c)}}(D_{k,(0:p)} - \hat{d}_k^-), \sqrt{\Sigma_e}]^T\}^T$$

where, $\alpha_i^{(c)}$ corresponds to a set of constant values;

$\Sigma_e$ corresponds to a covariance matrix associated with a sensor noise vector;

qr{ } is a function that computes a Q-R matrix decomposition of its input argument and returns the upper-triangular portion of the R matrix; and T is the matrix/vector transpose operation.

At step 160, the computer 28 determines a second predicted cross-covariance matrix $$\Sigma_{\tilde{\theta d},k}^-,$$

utilizing the equation:

$$\sum_{\tilde{\theta d},k} = \sum_{i=0}^{p} \alpha_i^{(c)}(W_{k,i} - \hat{\theta}_k^-)(D_{k,j} - \hat{d}_k)^T.$$

At step 162, the computer 28 determines a parameter gain matrix $L_k^\theta$, utilizing the equation:

$$L_k^\theta = \sum_{\tilde{\theta d},k} (S_{\tilde{d},k}^T S_{\tilde{d},k})^{-1}.$$

At step 164, the computer 28 determines an estimated battery state vector $\hat{x}_k^+$, indicative of a state of the battery 12 at the first predetermined time, utilizing the equation:

$$\hat{x}_k^+ = \hat{x}_k^- + L_k^x[y_k - \hat{y}_k].$$

At step 166, the computer 28 determines an estimated battery state vector square-root covariance matrix $S_{x,k}^+$, associated with the estimated battery state vector, utilizing the equation:

$$S_{x,k}^+ = \text{downdate}\{S_{x,k}^-, L_k^x S_{\tilde{y},k}\},$$

where downdate{ } computes the matrix downdate operation on its first argument using its second argument.

At step 168, the computer 28 determines an estimated battery parameter vector $\hat{\theta}_k^+$, indicative of a parameter of the battery 12 at the first predetermined time, utilizing the equation:

$$\hat{\theta}_k^+ = \hat{\theta}_k^- + L_k^\theta [d_k - \hat{d}_k].$$

At step 170, the computer 28 determines an estimated battery parameter vector square-root covariance matrix $S_{\tilde{\theta},k}^+$, associated with the estimated battery parameter vector, utilizing the equation:

$$S_{\tilde{\theta},k}^+ = \text{downdate}\{S_{\tilde{\theta},k}^-, L_k^\theta S_{\tilde{d},k}\}.$$

At step 172, the computer 28 selects new first and second predetermined times. After step 172, the method returns to step 120.

The system and the method for determining both an estimated battery state vector and an estimated battery parameter vector associated with the battery 12 provide a substantial advantage over other systems and methods. In particular, the system and method provide a technical effect of more accurately determining the estimated battery state vector and the estimated battery parameter vector for a battery having non-linear operational characteristics.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the terms first, second, etc. does not denote any order of importance, but rather the terms first, second, etc. are used to distinguish one element from another.

What is claimed is:

1. A system for determining an estimated battery state vector and an estimated battery parameter vector, the estimated battery state vector being indicative of a state of a battery at a first predetermined time, the estimated battery parameter vector being indicative of a parameter of the battery at the first predetermined time, the system comprising:

a sensor configured to generate a first signal indicative of an output variable of the battery; and a computer operably coupled to the sensor, the computer configured to determine a plurality of estimated augmented battery state vectors that are indicative of a state of the battery, a battery input noise, a sensor noise associated with a sensor measuring a battery output variable, an uncertainty of the state of the battery, an uncertainty of the battery input noise, and an uncertainty of the sensor noise at a second predetermined time prior to the first predetermined time, the computer further configured to determine a plurality of predicted battery state vectors that are indicative of the state of the battery and an uncertainty of the state of the battery at the first predetermined time based on the plurality of estimated augmented battery state vectors, the computer further configured to determine a plurality of predicted battery parameter vectors that are indicative of the parameter of the battery and an uncertainty of the parameter of the battery at the first predetermined time, the computer further configured to determine a first plurality of predicted battery output vectors that are indicative of at least one output variable of the battery and an uncertainty of the output variable at the first predetermined time based on the plurality of predicted battery parameter vectors, the computer further configured to determine a second plurality of predicted battery output vectors that are indicative of at least one output variable of the battery and the uncertainty of the output variable at the first predetermined time based on the plurality of estimated augmented battery state vectors and the plurality of predicted battery state vectors, the computer further configured to determine a battery output vector based on the first signal, the computer further configured to determine an estimated battery parameter vector indicative of the parameter of the battery at the first predetermined time based on the plurality of predicted battery parameter vectors, the first plurality of predicted battery output vectors, and the battery output vector, the computer further configured to determine an estimated battery state vector indicative of the state of the battery at the first predetermined time based on the plurality of predicted battery state vectors, the second plurality of predicted battery output vectors, and the battery output vector.

2. The system of claim 1, wherein the computer is further configured to retrieve an estimated battery state vector indicative of the state of the battery at the second predetermined time from a memory device;

the computer further configured to determine a first estimated augmented battery state vector indicative of the state of the battery, the battery input noise, and the sensor noise at the second predetermined time, based on the estimated battery state vector, an expected battery input noise vector, and an expected sensor noise vector;

the computer further configured to retrieve an estimated battery state vector covariance matrix indicative of the uncertainty of the state of the battery at the second predetermined time from the memory device;

the computer further configured to determine a first estimated augmented battery state vector covariance matrix indicative based on the estimated battery state vector covariance matrix, a covariance matrix indicative of the uncertainty of the battery input noise and a covariance matrix indicative of the uncertainty of the sensor noise; and the computer further configured to calculate the plurality of estimated augmented battery state vectors based on the first estimated augmented battery state vector and the first estimated augmented battery state vector covariance matrix.

3. The system of claim 2, wherein the computer is further configured to set one member of the plurality of estimated augmented battery state vectors equal to the first estimated augmented battery state vector;

the computer further configured to set a first additional set of L members of the plurality of estimated augmented battery state vectors equal to the first estimated augmented battery state vector added to a constant value multiplied by respective columns extracted from a matrix square-root of the first estimated augmented battery state vector covariance matrix, where L is the length of the first estimated augmented battery state vector; and the computer further configured to set a second additional set of L members of the plurality of estimated augmented battery state vectors equal to the constant value multiplied by respective columns extracted from the matrix square-root of the first estimated augmented battery state vector covariance matrix subtracted from the first estimated augmented battery state vector.

4. The system of claim 1, wherein the computer is further configured to retrieve an estimated battery state vector indicative of the state of the battery at the second predetermined time from a memory device;

the computer further configured to determine a first estimated augmented battery state vector indicative of the state of the battery, the battery input noise, and the sensor noise at the second predetermined time based on the estimated battery state vector, an expected battery input noise vector, and an expected sensor noise vector;

the computer further configured to retrieve an estimated battery state vector square-root covariance matrix indicative of the uncertainty of the state of the battery at the second predetermined time from the memory device;

the computer further configured to determine a first estimated augmented battery state vector square-root covariance matrix indicative of the uncertainty of the state of the battery, the battery input noise, and the sensor noise, based on the estimated battery state vector square-root covariance matrix, a covariance matrix indicative of the uncertainty of the battery input noise and a covariance matrix indicative of the uncertainty of the sensor noise; and the computer further configured to calculate the plurality of estimated augmented battery state vectors based on the first estimated augmented battery state vector and the first estimated augmented battery state vector square-root covariance matrix.

5. The system of claim 4, wherein the computer is further configured to set one member of the plurality of estimated augmented battery state vectors equal to the first estimated augmented battery state vector;

the computer further configured to set a first additional set of L members of the plurality of estimated augmented battery state vectors equal to the first estimated augmented battery state vector added to a constant value multiplied by respective columns extracted from the estimated augmented battery state vector square-root covariance matrix, where L is the length of the estimated augmented battery state vector; and the computer further configured to set a second additional set of L members of the plurality of estimated augmented battery state vectors equal to the constant value multiplied by respective columns extracted from the first estimated augmented battery state vector square-root covariance matrix subtracted from the first estimated augmented battery state vector.

6. The system of claim 1, wherein the computer is further configured to extract values indicative of the state of the battery and of the uncertainty of the state of the battery at the second predetermined time from the plurality of estimated augmented battery state vectors, to obtain a first plurality of estimated battery state vectors;

the computer further configured to extract values indicative of the battery input noise and an uncertainty of the battery input noise at the second predetermined time from the first plurality of estimated augmented battery state vectors, to obtain a plurality of estimated battery input noise vectors;

the computer further configured to generate a battery input vector having at least one measured value of a battery input variable at the second predetermined time;

the computer further configured to determine the plurality of predicted battery state vectors based on the first plurality of estimated battery state vectors, the first plurality of predicted battery input noise vectors, and the battery input vector.

7. The system of claim 1, wherein the computer is further configured to retrieve from a memory device an estimated battery parameter vector indicative of the parameter of the battery at the second predetermined time;

the computer further configured to retrieve an estimated battery parameter vector covariance matrix indicative of an uncertainty of the parameter of the battery at the second predetermined time from the memory device;

the computer further configured to determine an estimated battery parameter noise covariance matrix indicative of an uncertainty of a parameter noise at the second predetermined time;

the computer further configured to calculate the plurality of predicted battery parameter vectors based on the estimated battery parameter vector, the estimated battery parameter vector covariance matrix, and the estimated battery parameter noise covariance matrix.

8. The system of claim 7, wherein the computer is further configured to set one member of the plurality of predicted battery parameter vectors equal to the estimated battery parameter vector;

the computer further configured to determine a predicted battery parameter vector covariance matrix indicative of an uncertainty of the parameter of the battery at the first predetermined time based on the estimated battery parameter vector covariance matrix and the estimated battery parameter noise covariance matrix;

the computer further configured to set a first additional set of L members of the plurality of predicted battery parameter vectors equal to the first estimated battery parameter vector added to a constant value multiplied by respective columns extracted from a matrix square-root of the first predicted battery parameter vector covariance matrix, where L is the length of the first estimated battery parameter vector; and the computer further configured to set a second additional set of L members of the plurality of predicted battery parameter vectors equal to the constant value multiplied by respective columns extracted from a matrix square-root of the first predicted battery parameter vector covariance matrix subtracted from the first estimated battery parameter vector.

9. The system of claim 1, wherein the computer is further configured to retrieve an estimated battery parameter vector indicative of the parameter of the battery at the second predetermined time from the memory device;

the computer further configured to retrieve an estimated battery parameter vector square-root covariance matrix indicative of an uncertainty of the parameter of the battery at the second predetermined time from the memory device;

the computer further configured to determine an estimated battery parameter noise square-root covariance matrix indicative of an uncertainty of a parameter noise at the second predetermined time; and the computer further configured to calculate the plurality of predicted battery parameter vectors based on the estimated battery parameter vector, the estimated battery parameter vector square-root covariance matrix, and the estimated battery parameter noise square-root covariance matrix.

10. The system of claim 9, wherein the computer is further configured to set one member of the plurality of predicted battery parameter vectors equal to the estimated battery parameter vector;

the computer further configured to determine a predicted battery parameter vector square-root covariance matrix indicative of an uncertainty of the parameter of the battery at the first predetermined time based on the estimated battery parameter vector square-root covariance matrix and the estimated battery parameter noise covariance matrix;

the computer further configured to set a first additional set of L members of the plurality of predicted battery parameter vectors equal to the first estimated battery parameter vector added to a constant value multiplied by respective columns extracted from the first predicted battery parameter vector square-root covariance matrix, where L is the length of the first estimated battery parameter vector; and the computer further configured to set a second additional set of L members of the plurality of predicted battery parameter vectors equal to the constant value multiplied by respective columns extracted from the first predicted battery parameter vector square-root covariance matrix subtracted from the first estimated battery parameter vector.

11. The system of claim 1, wherein the computer is further configured to retrieve an estimated battery state vector indicative of the state of the battery at the second predetermined time from a memory device;

the computer further configured to generate a battery mean sensor noise vector indicative of the average sensor noise at the first predetermined time and a battery mean input noise vector indicative of the average battery input noise at the second predetermined time;

the computer further configured to generate a first battery input vector having at least one measured value of a battery input variable at the first predetermined time;

the computer further configured to generate a second battery input vector having at least one measured value of a battery input variable at the second predetermined time;

the computer further configured to determine the first plurality of predicted battery output vectors based on the plurality of predicted battery parameter vectors, the first battery input vector, the second battery input vector, the battery mean sensor noise vector, the battery mean input noise vector, and the estimated battery state vector.

12. The system of claim 1, wherein the computer is further configured to extract values indicative of the sensor noise and of the uncertainty of the sensor noise at the second predetermined time from the plurality of estimated augmented battery state vectors, to obtain a plurality of estimated sensor noise vectors;

the computer flirt her configured to generate the first battery input vector having at least one measured value of a battery input variable at the first predetermined time;

the computer further configured to determine the second plurality of predicted battery output vectors based on the plurality of predicted battery state vectors, the first battery input vector, the plurality of estimated sensor noise vectors.

13. The system of claim 1, wherein the computer is further configured to determine a first predicted battery output vector indicative of at least one output variable of the battery at the first predetermined time based on the first plurality of predicted battery output vectors;

the computer further configured to determine a predicted battery parameter vector indicative of the parameter of the battery at the first predetermined time based on an estimated battery parameter vector indicative of the parameter of the battery at the second predetermined time;

the computer further configured to determine a parameter gain matrix based on the predicted battery parameter vector, the first predicted battery output vector, the plurality of predicted battery parameter vectors, and the plurality of predicted battery output vectors; and the computer further configured to calculate the estimated battery parameter vector based on the battery output vector, the first predicted battery output vector, the predicted battery parameter vector, and the parameter gain matrix.

14. The system of claim 13, wherein the computer is further configured to determine the first predicted battery output vector by calculating a weighted average of the plurality of predicted battery output vectors.

15. The system of claim 13, wherein the computer is further configured to determine determine a predicted battery output vector covariance matrix based on the first predicted battery output vector and the plurality of predicted battery output vectors;

the computer further configured to determine a predicted cross-covariance matrix between a battery output vector and a battery parameter vector based on the first predicted battery output vector, the plurality of predicted battery output vectors, the predicted battery parameter vector, and the plurality of predicted battery parameter vectors; and the computer further configured to calculate the parameter gain matrix based on the predicted cross-covariance matrix and the predicted battery output vector covariance matrix.

16. The system of claim 15, wherein the computer is further configured to determine a predicted battery output vector square-root covariance matrix based on the first predicted battery output vector and the plurality of predicted battery output vectors;

the computer further configured to calculate the predicted battery output vector covariance matrix based on the predicted battery output vector square-root covariance matrix and the predicted battery output vector square-root covariance matrix.

17. The system of claim 13, wherein the computer is further configured to determine an innovation vector based on the battery output vector and the first predicted battery output vector;

the computer further configured to determine an update vector based on the parameter gain matrix and the innovation vector; and the computer further configured to calculate the estimated battery parameter vector based on the predicted battery parameter vector and the update vector.

18. The system of claim 13, wherein the computer is further configured to determine an estimated battery parameter vector covariance matrix at the first predetermined time based on the first predicted battery parameter vector, the first plurality of predicted battery parameter vectors, the parameter gain matrix, and the first predicted battery output vector covariance matrix.

19. The system of claim 13, wherein the computer is further configured to determine an estimated battery parameter vector square-root covariance matrix at the first predetermined time based on the first predicted battery parameter vector, the first plurality of predicted battery parameter vectors, the parameter gain matrix, and a predicted battery output vector square-root covariance matrix.

20. The system of claim 1, wherein the computer is further configured to determine a predicted battery state vector indicative of the state of the battery at the first predetermined time based on the plurality of predicted battery state vectors;

the computer further configured to determine a second predicted battery output vector indicative of at least one output variable of the battery at the first predetermined time based on the plurality of predicted output vectors;

the computer further configured to determine a state gain matrix based on the predicted battery state vector, the second predicted battery output vector, the plurality of predicted battery state vectors, and the second plurality of predicted battery output vectors; and the computer further configured to calculate the estimated battery state vector based on the predicted battery state vector, the second predicted battery output vector, the state gain matrix, and the battery output vector.

21. The system of claim 20, wherein the computer is configured to determine the predicted battery state vector by calculating a weighted average of the plurality of predicted battery state vectors.

22. The system of claim 20, wherein the computer is configured to determine the second predicted battery output vector by calculating a weighted average of the second plurality of predicted battery output vectors.

23. The system of claim 20, wherein the computer is further configured to determine a predicted battery output vector covariance matrix based on the second predicted battery output vector and the second plurality of predicted battery output vectors;

the computer further configured to determine a predicted cross-covariance matrix between a battery output vector and a battery state vector based on the second predicted battery output vector, the second plurality of predicted battery output vectors, the predicted battery state vector, and the plurality of predicted battery state vectors; and the computer further configured to calculate the state gain matrix based on the predicted cross-covariance matrix and the predicted battery output vector covariance matrix.

24. The system of claim 23, wherein the computer is further configured to determine a predicted battery output vector square-root covariance matrix based on the second predicted battery output vector and the second plurality of predicted battery output vectors; and the computer further configured to calculate the predicted battery output vector covariance matrix based on the predicted battery output vector square-root covariance matrix and the predicted battery output vector square-root covariance matrix.

25. The system of claim 20, wherein the computer is further configured to determine an innovation vector based on the second battery output vector and the second predicted battery output vector;

the computer further configured to determine an update vector based on the state gain matrix and the innovation vector; and the computer further configured to calculate the estimated battery state vector based on the predicted battery state vector and the update vector.

26. The system of claim 20, wherein the computer is further configured to determine an estimated battery state vector covariance matrix at the first predetermined time based on the predicted battery state vector, the plurality of predicted battery state vectors, the state gain matrix, and the predicted battery output vector covariance matrix.

27. The system of claim 20, wherein the computer is further configured to determine an estimated battery state vector square-root covariance matrix at the first predetermined time based on the predicted battery state vector, the plurality of predicted battery state vectors, the state gain matrix, and a predicted battery output vector square-root covariance matrix.

28. A method for determining an estimated battery state vector and an estimated battery parameter vector, the estimated battery state vector being indicative of a state of a battery at a first predetermined time, the estimated battery parameter vector being indicative of a parameter of the battery at the first predetermined time, the method comprising:

determining a plurality of estimated augmented battery state vectors that are indicative of a state of the battery, a battery input noise, a sensor noise associated with a sensor measuring a battery output variable, an uncertainty of the state of the battery, an uncertainty of the battery input noise, and an uncertainty of the sensor noise at a second predetermined time prior to the first predetermined time;

determining a plurality of predicted battery state vectors that are indicative of the state of the battery and an uncertainty of the state of the battery at the first predetermined time based on the plurality of estimated augmented battery state vectors;

determining a plurality of predicted battery parameter vectors that are indicative of the parameter of the battery and an uncertainty of the parameter of the battery at the first predetermined time;

determining a first plurality of predicted battery output vectors that are indicative of at least one output variable of the battery and an uncertainty of the output variable at the first predetermined time based on the plurality of predicted battery parameter vectors;

determining a second plurality of predicted battery output vectors that are indicative of at least one output variable of the battery and the uncertainty of the output variable at the first predetermined time based on the plurality of estimated augmented battery state vectors and the plurality of predicted battery state vectors;

determining a battery output vector having at least one measured value of a battery output variable obtained at the first predetermined time;

determining an estimated battery parameter vector indicative of the parameter of the battery at the first predetermined time based on the plurality of predicted battery parameter vectors, the first plurality of predicted battery output vectors, and the battery output vector;

determining an estimated battery state vector indicative of the state of the battery at the first predetermined time based on the plurality of predicted battery state vectors, the second plurality of predicted battery output vectors, and the battery output vector; and storing the estimated battery state vector and the estimated battery parameter vector in a memory device.

* * * * *